(12) United States Patent
Kim et al.

(10) Patent No.: US 10,147,354 B2
(45) Date of Patent: Dec. 4, 2018

(54) ORGANIC LIGHT EMITTING DISPLAY AND DRIVING METHOD THEREOF

(71) Applicant: LG Display Co., Ltd., Seoul (KR)

(72) Inventors: Seungtae Kim, Goyang-si (KR); Dongik Kim, Goyang-si (KR); Kiwon Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/659,529

(22) Filed: Jul. 25, 2017

(65) Prior Publication Data

US 2018/0033367 A1 Feb. 1, 2018

(30) Foreign Application Priority Data

Jul. 29, 2016 (KR) ........................ 10-2016-0097481

(51) Int. Cl.
| | |
|---|---|
| *G09G 3/32* | (2016.01) |
| *G09G 3/3233* | (2016.01) |
| *H01L 27/32* | (2006.01) |
| *H01L 27/108* | (2006.01) |
| *H01L 27/146* | (2006.01) |

(52) U.S. Cl.
CPC ..... *G09G 3/3233* (2013.01); *H01L 27/10882* (2013.01); *H01L 27/3248* (2013.01); *G09G 2300/0809* (2013.01); *G09G 2300/0819* (2013.01); *G09G 2300/0842* (2013.01); *G09G 2300/0861* (2013.01); *G09G 2320/0295* (2013.01); *G09G 2320/045* (2013.01); *H01L 27/14603* (2013.01)

(58) Field of Classification Search
CPC .. G09G 3/3208; G09G 3/3233; G09G 3/3258; G09G 2300/0809; H01L 27/10882; H01L 27/14603; H01L 27/32; H01L 27/3248
See application file for complete search history.

(56) References Cited

U.S. PATENT DOCUMENTS

| | | | | |
|---|---|---|---|---|
| 2007/0210994 | A1* | 9/2007 | Chen ................... | G09G 3/3233 345/76 |
| 2008/0100545 | A1* | 5/2008 | Hong .................. | G09G 3/325 345/82 |
| 2012/0050274 | A1* | 3/2012 | Yoo ..................... | G09G 3/003 345/419 |
| 2015/0035735 | A1* | 2/2015 | Kang .................. | G09G 3/3258 345/77 |
| 2015/0123953 | A1* | 5/2015 | Shim ................... | G09G 3/3233 345/205 |
| 2015/0154908 | A1* | 6/2015 | Nam ................... | G09G 3/3233 345/76 |

(Continued)

*Primary Examiner* — Joe H Cheng
(74) *Attorney, Agent, or Firm* — Fenwick & West LLP

(57) ABSTRACT

Disclosed is an organic light emitting display including: a display panel on which a plurality of gate lines, a plurality of data lines, and a plurality of pixels are arranged, each pixel including an organic light emitting diode (OLED); a gate driving circuit connected to the pixels through the gate lines; and a data driving circuit connected to the pixels through the data lines, wherein each of the pixels comprises: a driving thin film transistor (TFT); a first switch TFT; a second switch TFT; a third switch TFT; and a storage capacitor, and wherein the first to third TFTs and the driving TFT are P-type TFTs.

22 Claims, 24 Drawing Sheets

(56) References Cited

U.S. PATENT DOCUMENTS

| | | | |
|---|---|---|---|
| 2015/0179102 A1* | 6/2015 | Kim | G09G 3/3233 |
| | | | 345/77 |
| 2015/0187267 A1* | 7/2015 | Park | G09G 3/3233 |
| | | | 345/77 |
| 2015/0187268 A1* | 7/2015 | Tani | G09G 3/3233 |
| | | | 345/77 |
| 2016/0071445 A1* | 3/2016 | Kim | G09G 3/006 |
| | | | 345/212 |
| 2016/0163267 A1* | 6/2016 | Yang | G09G 3/3233 |
| | | | 345/690 |
| 2018/0102397 A1* | 4/2018 | Nie | G09G 3/3258 |

* cited by examiner

X1 or/and X2 : Vth EXTERNAL COMPENSATION OF THRESHOLD VOLTAGE
DP : $\mu$ INTERNAL COMPNESATION OF MOBILITY

FIG. 13
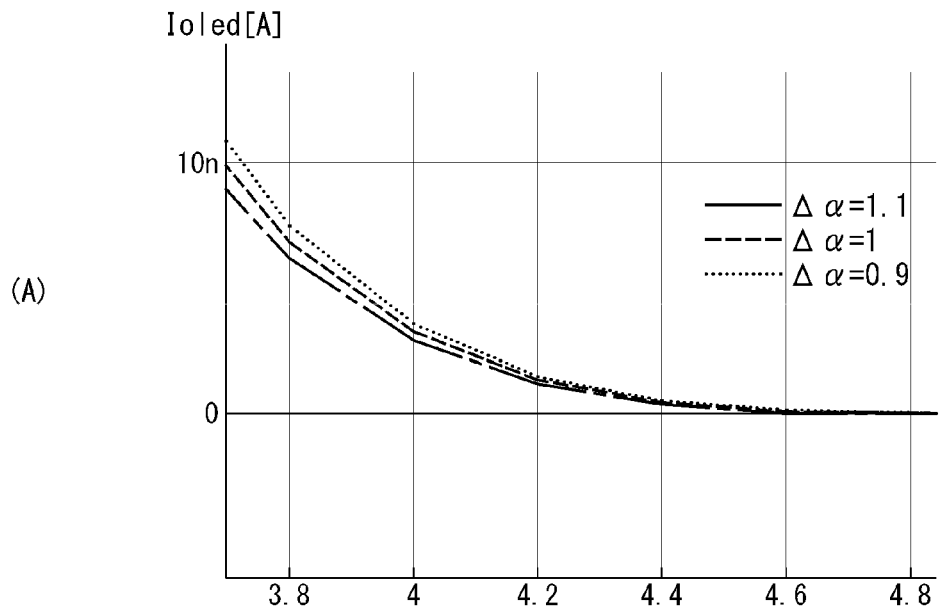
(A)
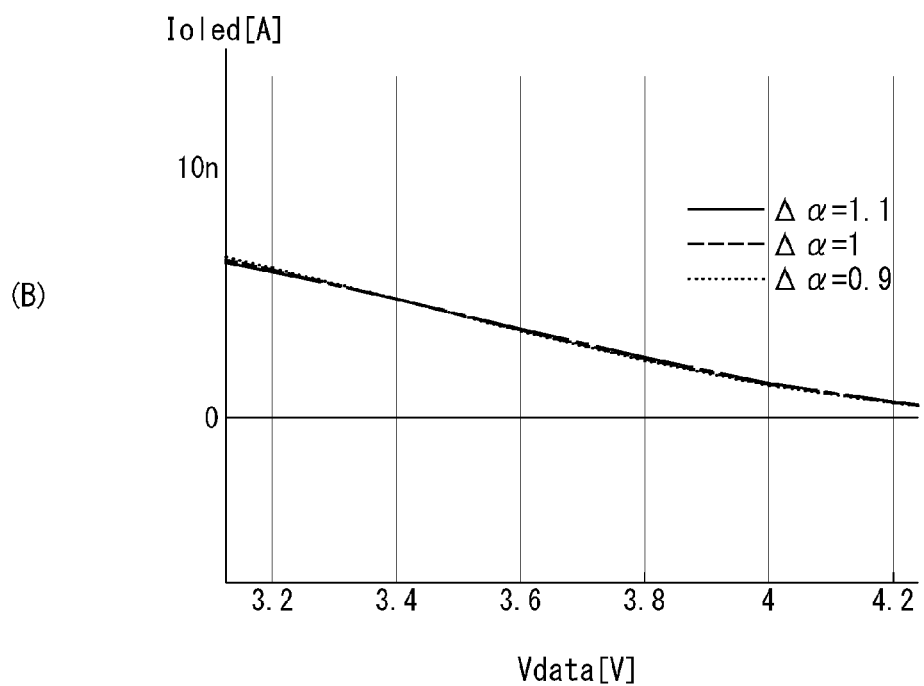
(B)

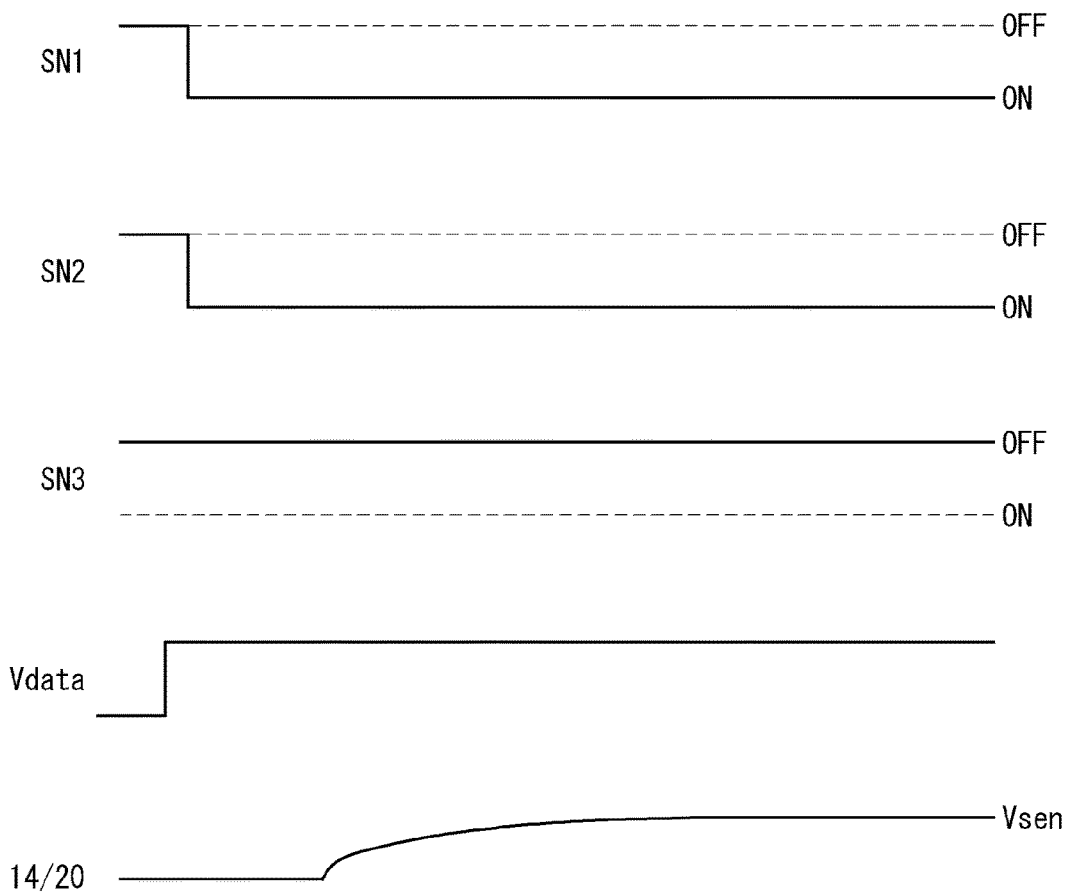

ORGANIC LIGHT EMITTING DISPLAY AND DRIVING METHOD THEREOF

BACKGROUND OF THE DISCLOSURE

This application claims the benefit of Korea Patent Application No. 10-2016-0097481 filed on Jul. 29, 2016, which is incorporated herein by reference for all purposes as if fully set forth herein.

FIELD OF THE DISCLOSURE

The present disclosure relates to an organic light emitting display and a driving method thereof.

DISCUSSION OF THE RELATED ART

An active matrix organic light emitting display includes an Organic Light Emitting Diodes (OLEDs) capable of emitting light by itself, and has advantages of a fast response time, a high light emitting efficiency, high luminance, and a wide viewing angle.

An OLED serving as a self-emitting element includes an anode electrode, a cathode electrode, and an organic compound layer formed between the anode electrode and the cathode electrode. The organic compound layer includes a hole injection layer HIL, a hole transport layer HTL, a light emitting layer EML, an electron transport layer ETL, and an electron injection layer EIL. When a driving voltage is applied to the anode electrode and the cathode electrode, holes passing through the hole transport layer HTL and electrons passing through the electron transport layer ETL move to the light emitting layer EML and form excitons. As a result, the light emitting layer EML generates visible light.

An organic light emitting display includes pixels arranged in a matrix form thereon, each pixel including an OLED, and adjusts luminance of the pixels according to a grayscale level of video data. Each pixel includes a driving Thin Film Transistor (TFT) to control a driving current flowing in the OLED. Electrical properties of the driving TFT, such as a threshold voltage and a mobility factor, are not uniform due to a process deviation and the like. Thus, a current dependent upon the same data voltage, and a corresponding light emitting amount of an OLED differ from pixel to pixel, which may cause luminance deviation.

As ways for compensating for an electrical property deviation of driving TFTs, an internal compensation method and an external compensation method are known. The internal compensation method is for compensating an electrical property deviation of a driving TFT of pixels using a gate-source voltage thereof which is set differently according to electrical properties of the driving TFT. The external compensation method is for measuring a sensing voltage corresponding to electrical properties of a driving TFT and modulating image data in an external circuit based on the sensing voltage to thereby compensate for an electrical property deviation of the driving TFT.

The internal compensation method has advantages of a simple compensation process and a short tact time, but it requires a complicated pixel circuit. The external compensation method requires a simple pixel circuit with a complicated compensation process and a long tact time of compensation.

In order to seek for advantages of both the internal compensation method and the external compensation method, a hybrid compensation method has been recently proposed. The hybrid compensation method is performed such that a threshold voltage deviation of a driving TFT is compensated by an external compensation method and a mobility deviation of the driving TFT is compensated by an internal compensation method. However, the hybrid compensation method has been studied only about N-type driving TFTs, and not about P-type driving TFTs. In order to implement a hybrid compensation method for P-type driving TFTs, a suitable pixel structure should be developed.

SUMMARY

Accordingly, the present disclosure aims to provide an organic light emitting display and a driving method thereof, so that a hybrid compensation method for P-type driving Thin Film Transistors (TFTs) are implemented.

To achieve the above object, the present disclosure provides an organic light emitting display including: a display panel on which a plurality of gate lines, a plurality of data lines, and a plurality of pixels are arranged, each pixel including an organic light emitting diode (OLED); a gate driving circuit connected to the pixels through the gate lines; and a data driving circuit connected to the pixels through the data lines, wherein each of the pixels comprises: a driving thin film transistor (TFT) having a gate electrode connected to a gate node, a source electrode connected to a source node, and a drain electrode connected to a drain node; a first switch TFT having a gate electrode connected to a first gate line, and configured to connect the gate node and a data line in response to a first gate signal; a second switch TFT having a gate electrode connected to a second gate line, and configured to connect the gate node and the drain node in response to a second gate signal; a third switch TFT having a gate electrode connected to a third gate line, and configured to connect the drain node and an anode electrode of the OLED in response to a third gate signal; and a storage capacitor connected between the gate node and the source node, and wherein the first to third TFTs and the driving TFT are P-type TFTs.

In addition, the present disclosure provides a driving method of an organic light emitting display which comprises a plurality of pixels, wherein each of the pixels comprises: a driving thin film transistor (TFT) having a gate electrode connected to a gate node, a source electrode connected to a source node, and a drain electrode connected to a drain node; an organic light emitting diode (OLED); and a plurality of switch TFTs, wherein the driving TFT and the plurality switch TFTs are P-type TFTs, and wherein the driving method comprises: in an initialization period, turning on a first switch TFT of the plurality of switch TFTs to apply a reference voltage of a data line to the gate node, turning on a second switch TFT of the plurality of switch TFTs to connect the gate node and the drain node, and turning on a third switch TFT of the plurality of switch TFTs to connect the drain node and the OLED; in a programming period following the initialization period, turning on the first switch TFT to apply a data voltage of the data line to the gate node, turning on the second switch TFT to connect the gate node and the drain node, and turning off the third switch TFT to disconnect the drain node and the OLED; in a compensation period following the programming period, turning off the first switch TFT to disconnect the data line and the gate node, turning on the second switch TFT to connect the gate node and the drain node, and turning off the third switch TFT to disconnect the drain node and the OLED; and in an emission period following the compensation period, turning off the first switch TFT to disconnect the data line and the gate node, turning off the second switch TFT to disconnect the gate node and the drain node, and turning on the third switch TFT to connect the drain node and the OLED.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 13 and 14 are diagrams for comparison of simulation results about a driving current deviation before and after compensation of mobility of a driving TFT of a pixel of the present disclosure; and FIGS. 15 to 17 are diagrams schematically illustrating an external compensation method of compensating for a threshold voltage of a driving TFT of a pixel of the present disclosure.

DETAILED DESCRIPTION OF THE ILLUSTRATED EMBODIMENTS

Figure 1:
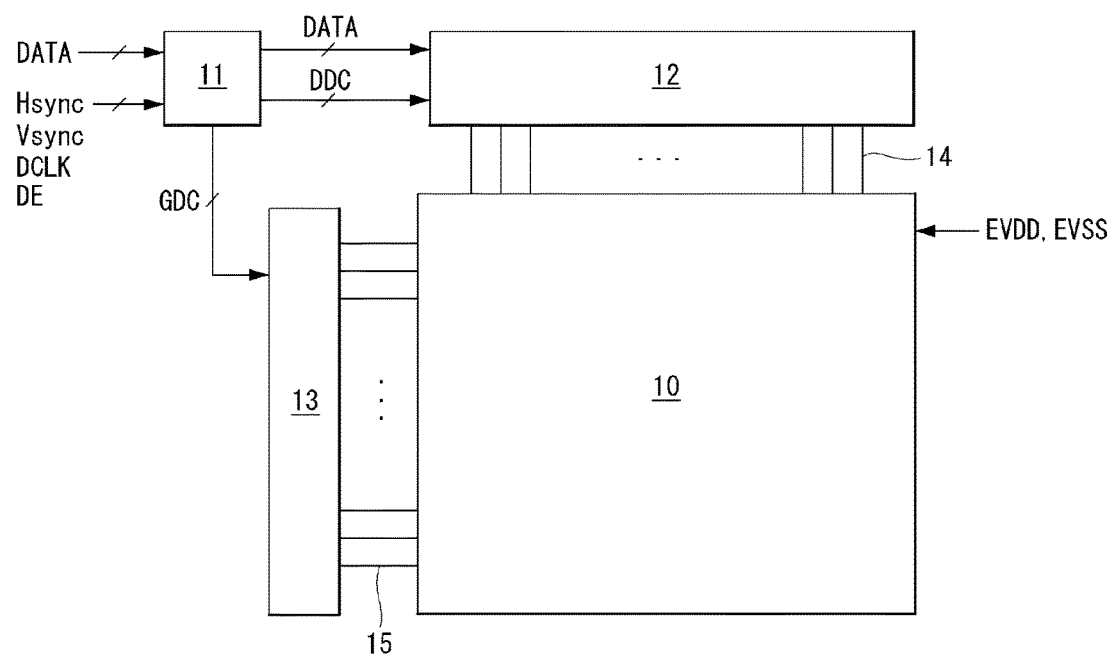
FIG. 1 shows an organic light emitting display, according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In description of embodiments of the present disclosure, when a relationship of two elements is described using "on", "above", "below", "next", etc., this description should be construed as one or more elements can be positioned between the two elements unless "directly" is used.

In description of embodiments of the present disclosure, when an element or layer is "on" a different element or layer, this description should be construed in that another layer or element is on the different element or positioned between the two elements.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The same reference numerals denote the same elements throughout the specification.

The size and thickness of each element in the drawings are illustrated by way of example, and aspects of the present disclosure are not limited thereto.

Features of various embodiments of the present disclosure may be partially or overall coupled to or combined with each other, and may be variously inter-operated with each other and driven technically, as those skilled in the art can sufficiently understand. The embodiments of the present disclosure may be carried out independently from each other, or may be carried out together in co-dependent relationship.

Hereinafter, embodiments of the present disclosure will be described with reference to accompanying drawings.

Figure 2:
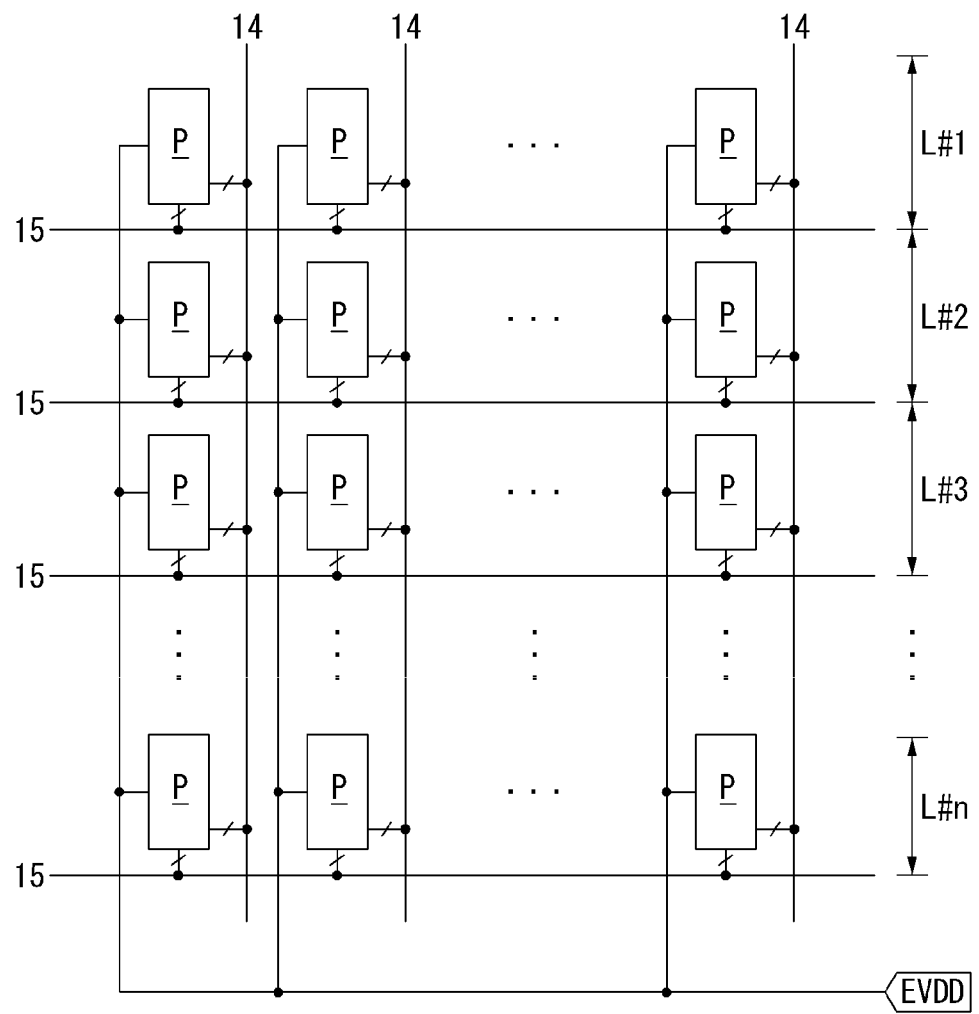
FIG. 2 shows a pixel array formed in a display panel of FIG. 1, according to an embodiment.
Figure 3:
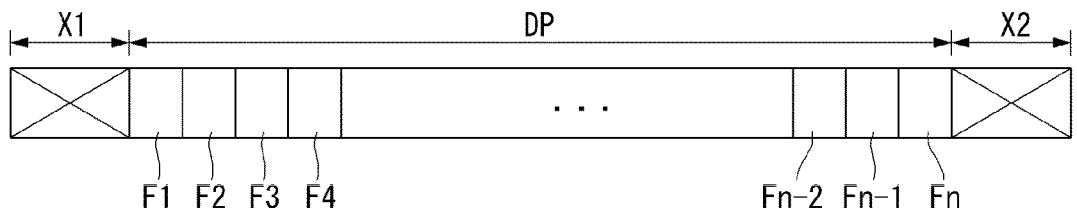
FIG. 3 shows a period in which electrical property deviation of a driving Thin Film Transistor (TFT) is compensated, according to a hybrid compensation method of the present disclosure.

FIG. 1 shows an organic light emitting display, according to an embodiment of the present disclosure. FIG. 2 shows a pixel array formed in a display panel of FIG. 1. FIG. 3 shows a period in which electrical property deviation of a driving Thin Film Transistor (TFT) is compensated, according to a hybrid compensation method of the present disclosure.

Referring to FIGS. 1 and 2, an organic light emitting display, according to an embodiment of the present disclosure, includes a display panel 10, a data driving circuit 12, a gate driving circuit 13, and a timing controller 11.

A plurality of data lines 14 and a plurality of gate lines 15 are intersecting in the display panel 10, and pixels P are arranged in a matrix form at each intersection. The number of gate lines 15 connected to each pixel P may vary depending on a pixel structure. For example, three gates lines 15A, 15B, and 15C (see FIG. 4) may be connected to each pixel P, four gate lines 15A, 15B, 15C, and 15D (see FIG. 7) may be connected to each pixel P, or five gate lines 15A, 15B, 15C, 15D, and 15E (see FIG. 10) may be connected to each pixel. In addition, additional reference lines 20 (see FIG. 10) for supplying a reference voltage to the pixels P may be provided in the display panel 10, depending on a pixel structure.

Each pixel P are supplied with a high-potential driving voltage EVDD and a low-potential driving voltage EVSS from a power generation unit (not shown). Each pixel P may be in any of various connection structures (see FIGS. 4, 7, and 10), so that a P-type hybrid compensation method can be implemented. The present disclosure compensates for a variation in a threshold voltage and a variation in mobility of a driving TFT according to the P-type hybrid compensation method. That is, the present disclosure compensates for non-uniform luminance caused by a threshold voltage deviation of a driving TFT according to an external compensation method, and compensate for non-uniform luminance caused by a mobility deviation of the driving TFT according to an internal compensation method.

The timing controller 11 generates a data control signal DDC for controlling the operation timing of the data driving circuit 12, and a gate control signal GDC for controlling the operation timing of the gate driving circuit 13 based on timing signals such as a vertical synchronization signal Vsync, a horizontal synchronization signal Hsync, a dot clock signal DCLK, and a data enable signal DE.

The timing controller 11 determines whether it is in a normal driving mode or a sensing driving mode, and activates control signals in a manner appropriate for each mode. The normal driving mode is for displaying an input image based on a predetermined reference signal (a driving voltage enable signal, a vertical synchronization signal, a data enable signal, a driving voltage disable signal, etc), and the sensing mode is for sensing and compensating a threshold voltage of a driving TFT. The normal driving mode may be activated in an image display period of FIG. 3, and the sensing mode may be activated in a first non-display period X1 at the front of the image display period DP of FIG. 3 and/or a second non-display period X2 at the rear of the image display period DP. In FIG. 3, X1 or/and X2 indicates external compensation of threshold voltage Vth, and DP indicates internal compensation of mobility μ.

A Variation in the mobility of the driving TFT may be compensated by an internal compensation method in the image display period DP in which the normal driving mode is activated. A variations in the threshold voltage of the driving TFT may be compensated by an external compensation method in the first non-display period X1 and/or the second non-display period X2 in which the sensing mode is activated. The first non-display period X1 is defined as a period of time which starts immediately after application of a driving voltage in accordance with a driving voltage enable signal and ends immediately at the beginning of the image display period DP. The second non-display period X2 is defined as a period of time which starts immediately after the end of the image display period DP and ends immediately upon blocking of a driving voltage in accordance with a driving voltage disable signal. A variation in the threshold voltage of the driving TFT can be measured more accurately when an OLED is not emitting light. Thus, the sensing mode operates in the first non-display period X1 and/or the second non-display period X2 in which the OLED does not emit light.

Based on sensing data which is received from the data driving circuit 12 in the sensing mode for external compensation, the timing controller 11 calculates a compensation value by which a threshold voltage deviation of driving TFTs of pixels P can be compensated. Then, the timing controller 11 may correct input image data DATA with the calculated compensation value. In the normal driving mode for internal compensation, the timing controller 11 may provide the corrected image data DATA to the data driving circuit 12.

In the sensing mode, the data driving circuit 12 may provide a specific data voltage to the pixels P, sense a threshold voltage of driving TFTs included in the pixels P, convert the sensed voltage into sensing data, and output the sensing data in the form of a digital signal. The data driving circuit 12 may further include a sensing unit connected to sensing channels. The sensing channels may be the data lines 14 or the reference lines 20.

In the normal driving mode, the data driving circuit 12 is supplied with image data DATA, in which a variation in the threshold voltage of the driving TFTs is compensated, from the timing controller 11. Then, the data driving circuit 12 converts the image data DATA into a data voltage for displaying an image in response to a data control signal DDC, and supplies the data voltage to the data lines 14. In one embodiment, in the normal driving mode, the data driving circuit 12 may supply a data voltage and a reference voltage, alternatively, to the data line 14 in response to a data control signal DDC (see FIGS. 4 and 7). In another embodiment, in the normal driving mode, the data driving circuit 12 may supply the data voltage to the data lines 14 and the reference voltage to the reference lines 20 in response to the data control signal DDC (see FIG. 10).

In the normal driving mode, the gate driving circuit 13 may generate a gate signal in response to the gate control signal GDC. In the sensing mode, the gate driving circuit 13 may generate a gate signal in response to the gate control signal GDC. A gate signal is applied to all pixels arranged in the same horizontal line L#1 to L#n, and multiple gate signals may be applied to each horizontal line. The gate driving circuit 13 may be formed directly on the display panel 10 in the form of Gate-driver In Panel.

Figure 4:
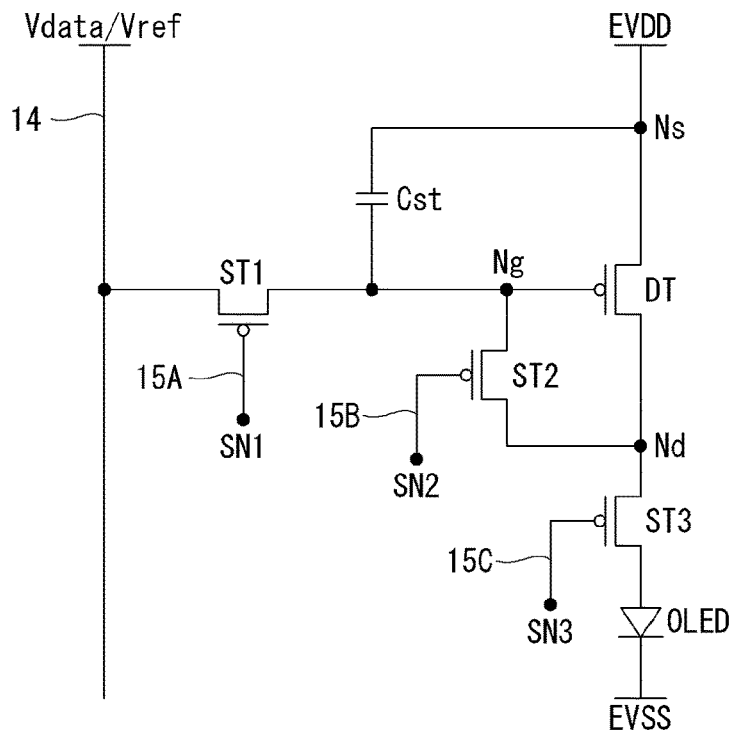
FIG. 4 is an equivalent circuit of a pixel, to which a hybrid compensation method is applied, according to a first embodiment of the present disclosure.

FIG. 4 is an equivalent circuit of a pixel, in which a hybrid compensation method is implemented, according to a first embodiment of the present disclosure.

Referring to FIG. 4, a pixel P of the present disclosure may include an OLED, a driving TFT DT, a storage capacitor Cst, a first switch TFT ST1, a second switch TFT ST2, and a third switch TFT ST3. TFTs composing a pixel P may be implemented as P type TFTs. In addition, semiconductor layer may include polysilicon or oxide.

The OLED may include a cathode electrode connected to an input terminal of the low potential driving voltage EVSS, an anode electrode connected to a third switch TFT ST3, and an organic compound layer positioned between the anode electrode and the cathode electrode. The OLED is a light emitting element of which a light emitting amount is controlled by a driving current.

The driving TFT DT is a driving element for controlling a driving current that is input to the OLED based on a source-gate voltage Vsg. The driving TFT DT includes a gate electrode connected to a gate node Ng, a source electrode connected to a source node Ns, and a drain electrode connected to a drain node Nd. The source node Ns is connected to an input terminal of the high potential driving voltage EVDD.

The storage capacitor Cst is connected between the gate node Ng and the source node Ns.

The first switch TFT ST1 includes a gate electrode connected to a first gate line 15A, and connects a data line 14 and the gate node Ng in response to the first gate signal SN1. The first switch TFT ST1 includes a source electrode connected to the data line 14, and a drain electrode connected to the gate node Ng.

The second switch TFT ST2 includes a gate electrode connected to a second gate line 15B, and connects the gate node Ng and the drain node Nd in response to a second gate signal SN2. The second switch TFT ST2 includes a source electrode connected to the drain node Nd, and a drain electrode connected to the gate node Ng.

The third switch TFT ST3 includes a gate electrode connected to a third gate line 15C, and connects the drain node Nd and an OLED anode electrode in response to a third gate signal SN3. The third switch TFT ST3 includes a source electrode connected to the drain node Nd, and a drain electrode connected to the OLED anode electrode.

A pixel P in the structure described above is supplied through the data line 14 with a data voltage Vdata and a reference voltage Vref, alternatively, and with a high potential driving voltage EVDD.

Figure 5:
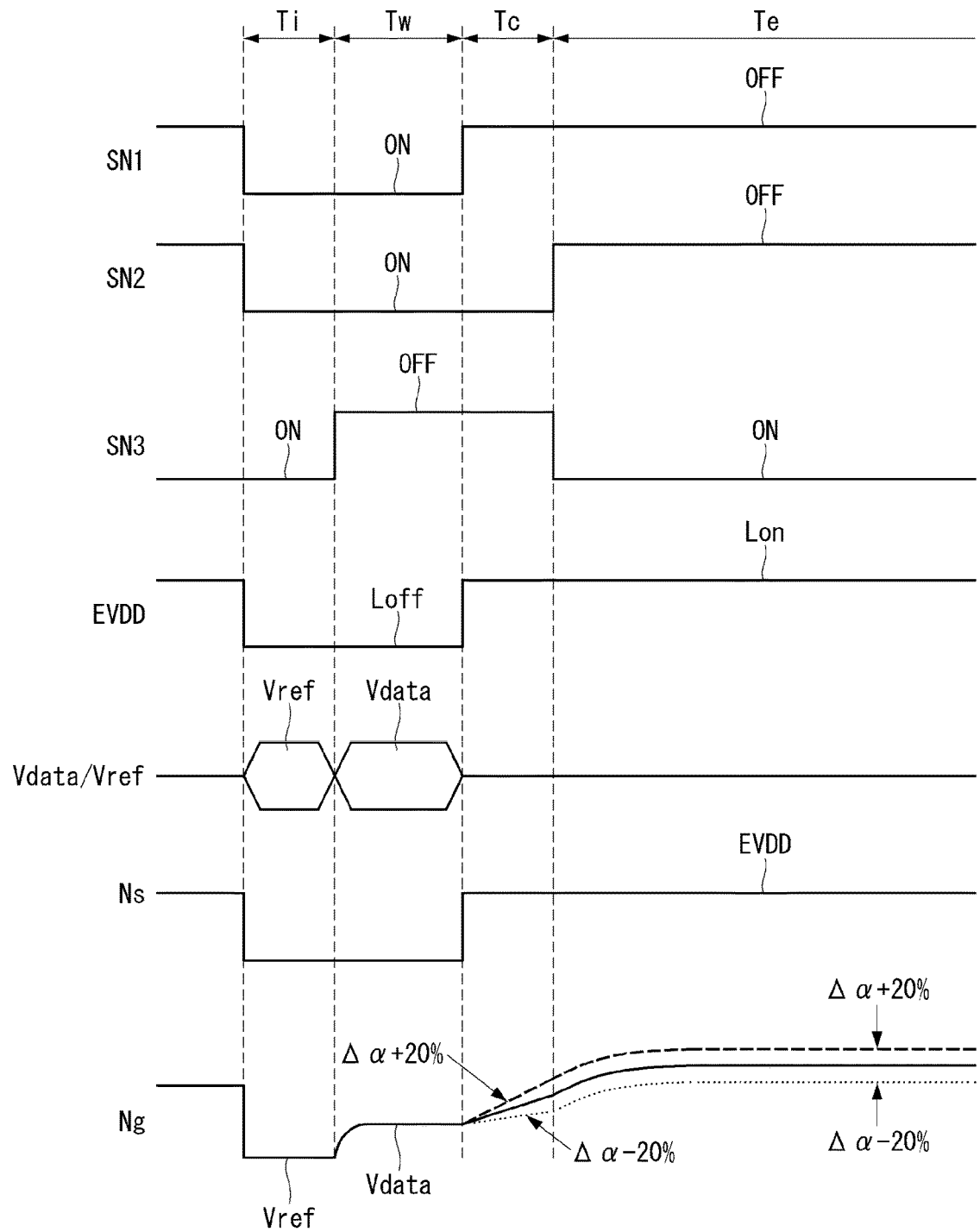
FIG. 5 is a timing diagram illustrating compensation of a variation in mobility of a driving TFT of a pixel of FIG. 4.

FIG. 5 is a timing diagram illustrating compensation of a variation in mobility of a driving TFT of a pixel of FIG. 4. FIGS. 6A, 6B, 6C, and 6D are respective equivalent circuits of a pixel in an initialization period, a programming period, a compensation period, and an emission period shown in FIG. 5.

Referring to FIG. 5, in a normal driving mode for internal compensation, one frame includes an initialization period Ti, a programming period Tw, a compensation period Tc, and an emission period Te.

The data driving circuit 12 supplies a reference voltage Vref to the data lines 14 in the initialization period Ti before the compensation period TC, and supplies a data voltage Vdata to the data lines 14 in the programming period Tw between the initialization period Ti and the compensation period Tc. Accordingly, the reference voltage Vref is applied to the gate node Ng through the first switch TFT ST1 during the initialization period Ti, and then the data voltage Vdata is applied to the gate node Ng through the first switch TFT ST1 during the programming period Tw.

In addition, in the initialization period T1 and the programming period Tw, the high potential driving voltage EVDD is input at the OFF level Loff that enables turning off the driving TFT DT. In the compensation period Tc and the emission period Te, the high potential driving voltage EVDD is input at the ON level Lon that enables turning on the driving TFT DT. In this manner, it is possible to control a driving current path and secure operation stability.

Figure 6A:
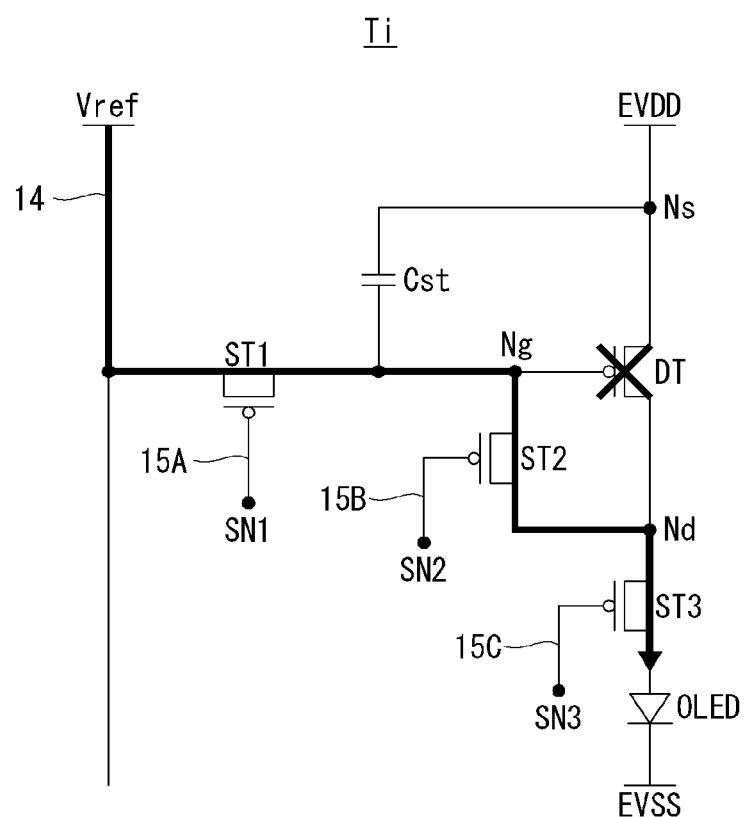
FIGS. 6A, 6B, 6C, and 6D are respective equivalent circuits of a pixel in an initialization period, a programming period, a compensation period, and an emission period shown in FIG. 5.

Referring to FIGS. 5 and 6A, the gate node Ng and an OLED anode electrode are initialized to the reference voltage Vref in the initialization period Ti. During the initialization period Ti, the first to third switch TFTs ST1, ST2, and ST3 are respectively turned on by the first to third gate signals SN1, SN2, and SN3 of the ON level. In addition, the reference voltage Vref is applied to the data lines 14. In the initialization period Ti, the high potential driving voltage EVDD is input at the OFF level thereby to turn off the driving TFT DT. During the initialization period Ti, the potential of the source node NS becomes the high potential driving voltage EVDD of the OFF level, and the potential of the gate node Ng becomes the reference voltage Vref.

Figure 6B:
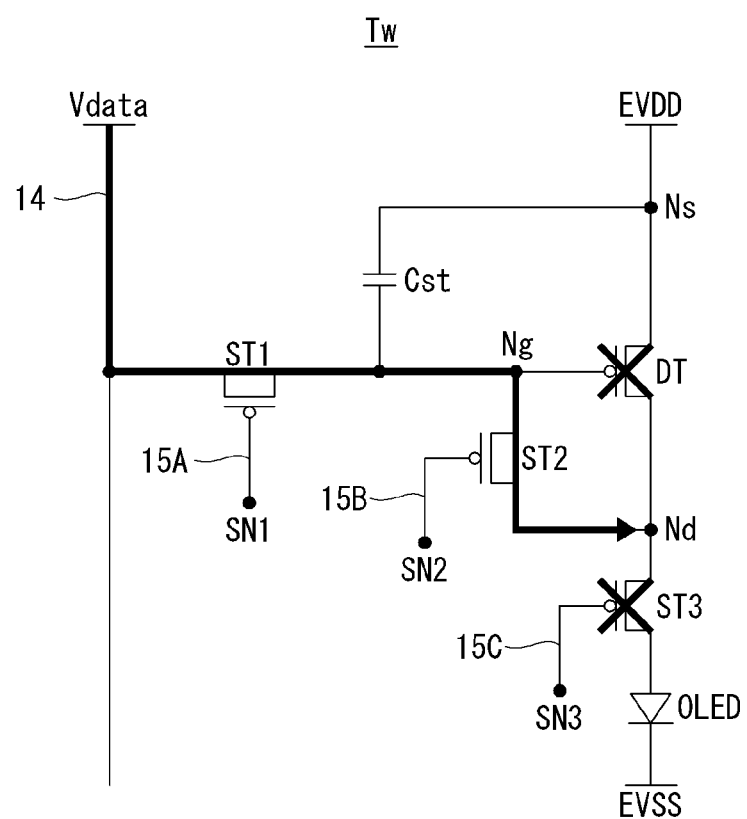

Referring to FIGS. 5 and 6B, the gate node Ng is programmed to the data voltage Vdata in the programming period Tw. During the programming period Tw, the first and second switch TFTs ST1 and ST2 are maintained in the turned-on state in response to the first and second gate signals SN1 and SN2 of the ON level, while the third switch TFT ST3 is turned off in response to a third gate signal SN3 of the OFF level. During the programming period Tw, the data voltage Vdata is applied to the data lines 14. During the programming period Tw, the high potential driving voltage EVDD is maintained at the OFF level Loff, thereby turning off the driving TFT DT. During the programming period Tw, the potential of the source node Ns becomes the high potential driving voltage EVDD of the OFF level Loff, and the potential of the gate node Ng becomes the data voltage Vdata.

Figure 6C:
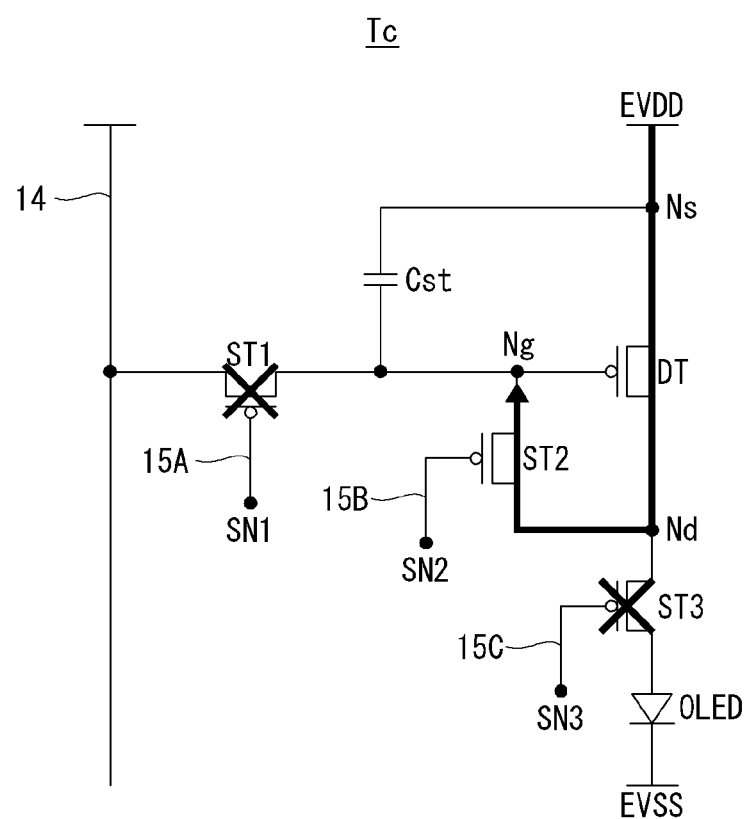

Referring to FIGS. 5 and 6C, in the compensation period Tc, the potential of the source node Ns is fixed to the high potential driving voltage EVDD, and the potential of the gate node Ng is determined differently according to mobility of the driving TFT DT. To this end, in the compensation period Tc, the potential of the source node Ns is increased and fixed to the high potential driving voltage EVDD of the ON level Lon.

During the compensation period Tc, the high potential driving voltage EVDD is increased to the ON level Lon, thereby turning on the driving TFT DT. A driving current is flowing in the driving TFT DT, and the driving current corresponds to a value obtained by subtracting the data voltage Vdata from the source-gate voltage Vsg that is the high potential voltage EVDD of the ON level Lon. The first switch TFT ST1 is turned off in response to a first gate signal SN1 of the OFF level, while the second switch TFT ST2 is maintained in the turned-on state in response to a second gate signal SN2 of the ON level. As a result, during the compensation period Tc, the driving TFT DT is diode-connected (that is, the TFT DT operates as a diode) due to a short circuit of the gate node Ng and the drain node Nd, and the potential of the gate node Ng is increased by the driving current. The potential of the gate node Ng is increased in proportion to the magnitude of the driving current. The magnitude of the driving current is proportional to the mobility of the driving TFT DT, and thus, the greater the mobility of the driving TFT DT, the higher the potential of the gate node Ng. In FIG. 5, a solid line, a bold dotted line, and a thin dotted line are drawn to show variation in the potential of the gate node Ng. The solid line corresponds to a case where the mobility of the driving TFT DT is $\Delta\alpha$; the bold dotted line corresponds to a case where the mobility of the driving TFT DT is $\Delta\alpha+20\%$; and the think dotted line corresponds to a case where the mobility of the driving TFT DT is $\Delta\alpha-20\%$.

The source-gate voltage Vsg of the driving TFT DT is determined to be inversely proportional to mobility of the driving TFT DT in the compensation period Tc, and therefore, a driving current deviation caused by a variation in mobility of the driving TFT DT is compensated automatically. That is, when the mobility of the driving TFT DT is $\Delta\alpha+20\%$, a small magnitude of the source-gate voltage Vsg of the driving TFT DT is obtained as compared to when the mobility of the driving TFT DT is $\Delta\alpha$, and thus, the driving current generated by the driving TFT DT is compensated to be close to a driving current generated when the mobility of the driving TFT DT is $\Delta\alpha$. In addition, when the mobility of the driving TFT DT is $\Delta\alpha-20\%$, a greater magnitude of the source-gate voltage Vsg of the driving TFT DT is obtained as compared to when the mobility of the driving TFT DT is $\Delta\alpha$, and thus, the driving current generated by the driving TFT DT is compensated to be close to a driving current generated when the mobility of the driving TFT DT is $\Delta\alpha$.

During the compensation period Tc, the third switch TFT ST3 is maintained in the turned-off state in response to an off-level third gate signal SN3 of the OFF level in order to prevent flowing of the driving current into the OLED.

Figure 6D:
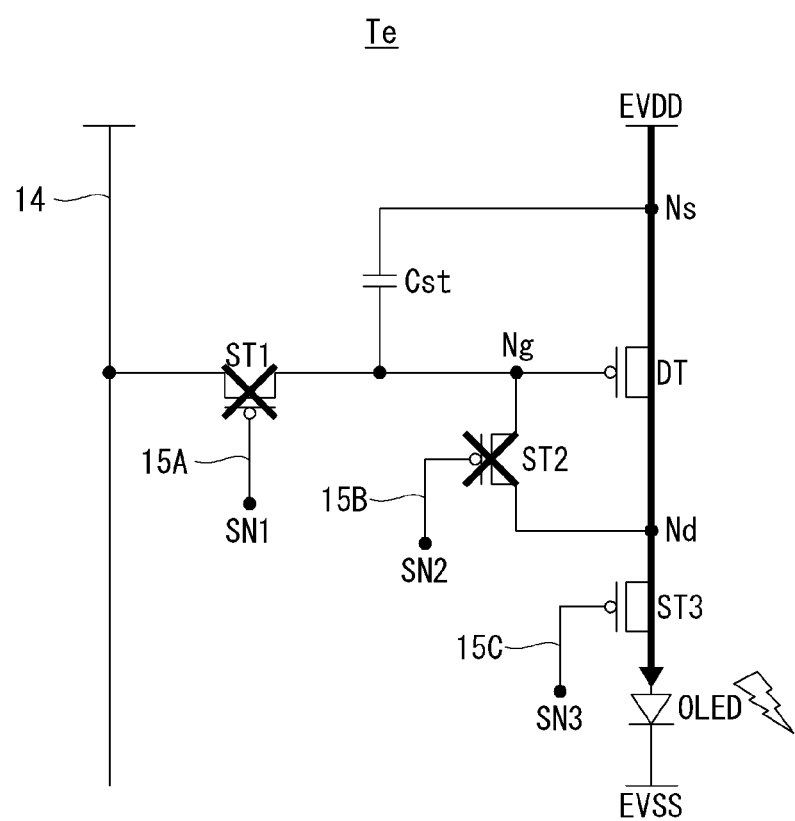

Referring to FIGS. 5 and 6D, a source-gate voltage Vsg of the driving TFT DT set in the compensation period TC is maintained even in the emission period Te, and accordingly, a driving current caused by compensation of mobility is following in the driving TFT DT. The third switch TFT ST3 is turned on in the emission period Te in response to a third gate signal SN3 of the ON level, so that a driving current generated by the driving TFT DT is applied to the OLED. The OLED emits light of a brightness corresponding to the driving current.

Figure 7:
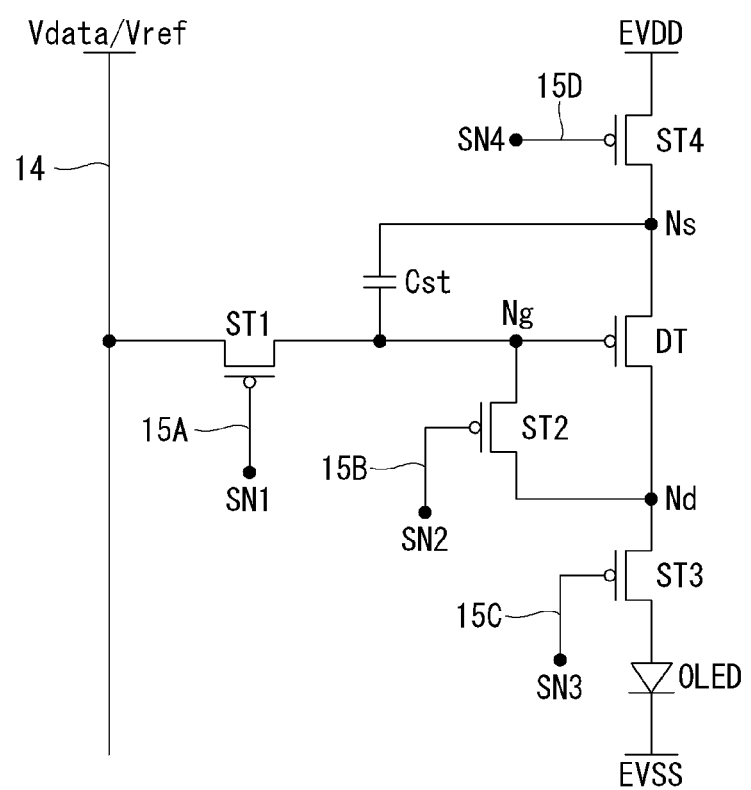
FIG. 7 is an equivalent circuit of a pixel, to which a hybrid compensation method is applied, according to a second embodiment of the present disclosure.

FIG. 7 is an equivalent circuit of a pixel, to which a hybrid compensation method is applied, according to a second embodiment of the present disclosure.

Referring to FIG. 7, a pixel P of the present disclosure may include an OLED, a driving TFT DT, a storage capacitor Cst, a first switch TFT ST1, a second switch TFT ST2, a third switch TFT ST3, and a fourth switch TFT ST4. The TFTs composing the pixel P may be implemented as P-type TFTs. In addition, a semiconductor layer of each TFT composing the pixel P may include polysilicon or oxide.

Compared to the pixel P of FIG. 4, the pixel P of FIG. 7 further comprises a fourth switch TFT ST4 to which a source node Ns is connected. Except for this difference, the pixel P of FIG. 7 is substantially identical to the pixel P of FIG. 4.

The fourth switch TFT ST4 includes a gate electrode connected to a fourth gate line 15D, and connects an input terminal of the high potential driving current EVDD and the source node Ns in response to a fourth gate signal SN4. The fourth switch TFT ST4 includes a source electrode connected to the input terminal of the high potential driving voltage EVDD, and a drain electrode connected to the source node Ns.

Similarly to the pixel P of FIG. 4, the pixel P of FIG. 7 is supplied with a data voltage Vdata and a reference voltage Vref, alternatively, through a data line 14. However, since the pixel P of FIG. 7 includes the fourth switch TFT ST4 capable of controlling a driving current path, the pixel P of FIG. 7 is supplied with a high potential driving voltage EVDD of Level 1.

Figure 8:
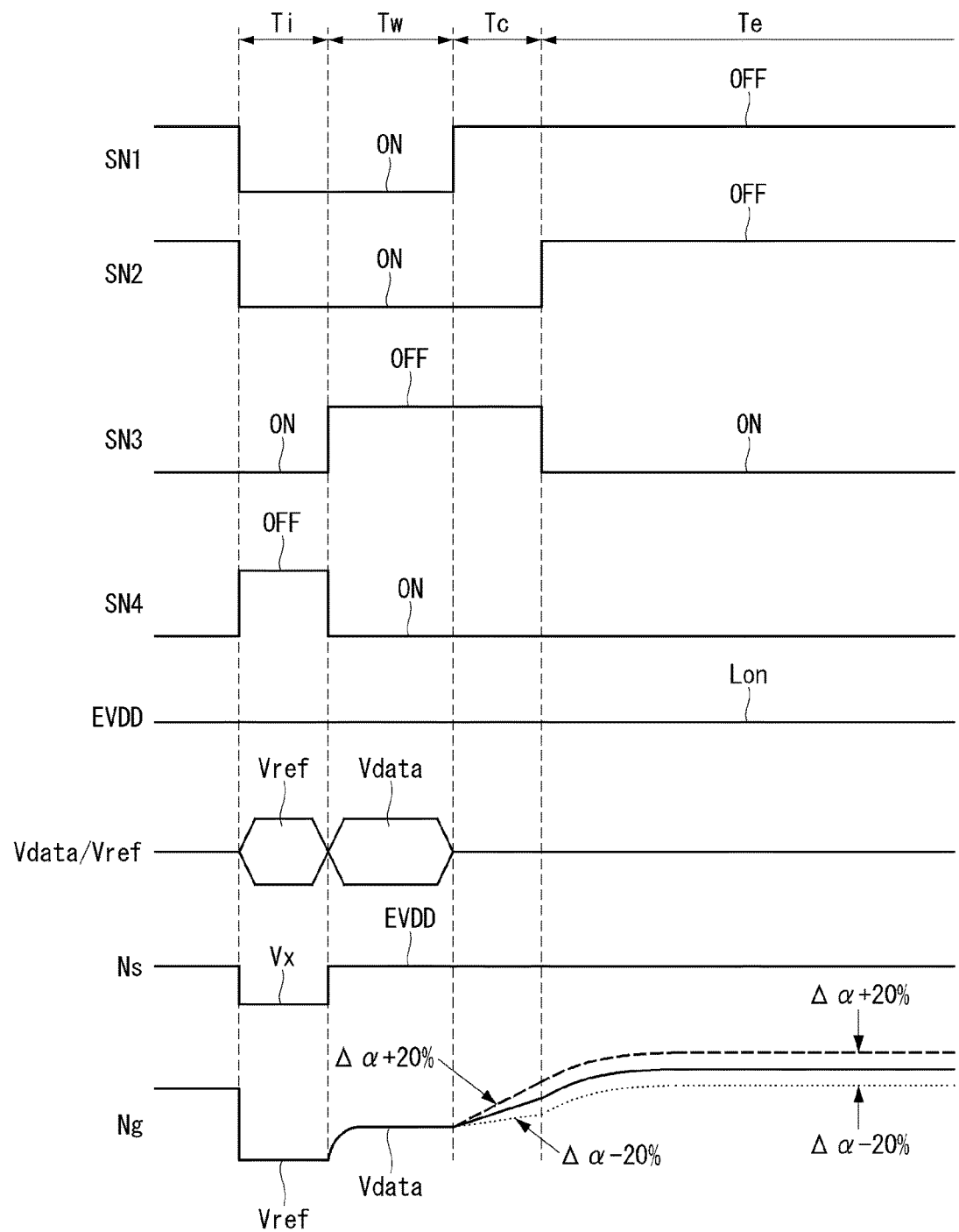
FIG. 8 is a timing diagram showing compensation of a variation in mobility of a driving TFT in the pixel of FIG. 7.

FIG. 8 is a timing diagram showing compensation of a variation in mobility of a driving TFT in the pixel of FIG. 7. FIGS. 9A, 9B, 9C, and 9D are respective equivalent circuits of a pixel in an initialization period, a programming period, a compensation period, and an emission period shown in FIG. 8.

Referring to FIG. 8, in a normal driving mode for internal compensation, one frame includes an initialization period Ti, a programming period Tw, a compensation period Tc, and an emission period Te.

The data driving circuit 12 supplies a reference voltage Vref to the data lines 14 in the initialization period Ti before the compensation period Tc, and supplies a data voltage Vdata to the data lines 14 in the programming period Tw between the initialization period Ti and the compensation period Tc. As a result, the reference voltage Vref is applied to a gate node Ng through a first switch TFT ST1 in the initialization period Ti, and the data voltage Vdata is applied to the gate node Ng in the programming period Tw through the first switch TFT ST1.

In addition, the high potential driving voltage EVDD is always input at the ON level Lon during one frame. Instead, as the fourth switch TFT ST4 is turned off, it is possible to control a driving current path and secure operation stability.

Figure 9A:
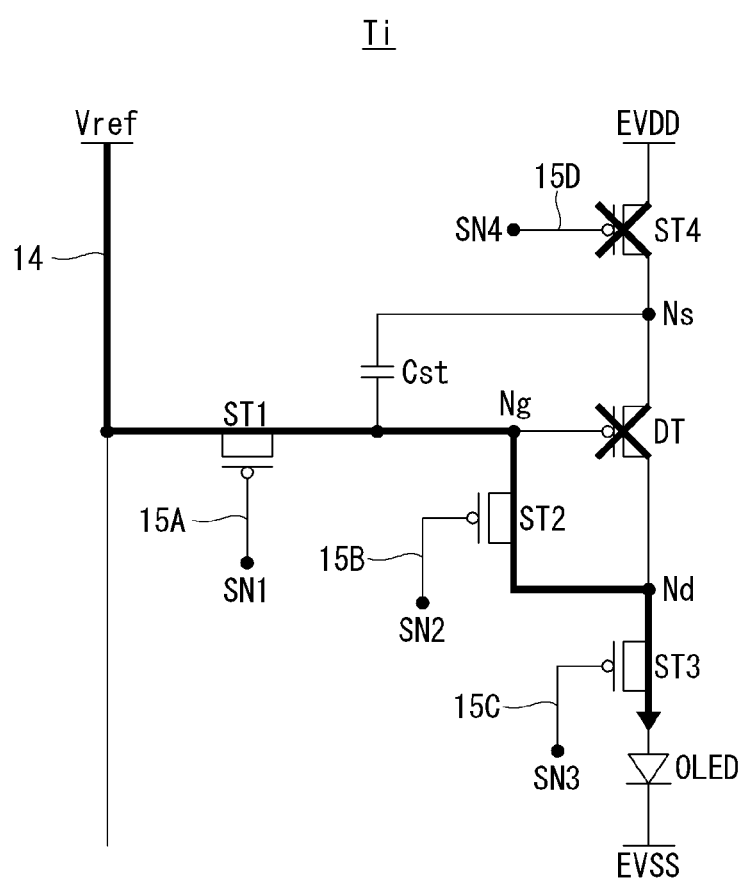
FIGS. 9A, 9B, 9C, and 9D are respective equivalent circuits of a pixel in an initialization period, a programming period, a compensation period, and a emission period shown in FIG. 8.

Referring to FIGS. 8 and 9A, the gate node Ng and an OLED anode electrode of the OLED are initialized to the reference voltage Vref in the initialization period Ti. During the initialization period Ti, first to third switch TFTs ST1, ST2, and ST3 are respectively turned on in response to first to third gate signals SN1, SN2, and SN3 of the ON level. In addition, the reference voltage Vref is applied to the data line 14. During the initialization period Ti, the fourth switch TFT ST4 is turned off in response to a fourth gate signal SN4 of the OFF level, thereby turning off the driving TFT DT. During the initialization period Ti, the potential of the gate node Ng becomes the reference voltage Vref, and thus, the potential of the source node Ns is also reduced to Vx due to coupling effects of the storage capacitor Cst.

Figure 9B:
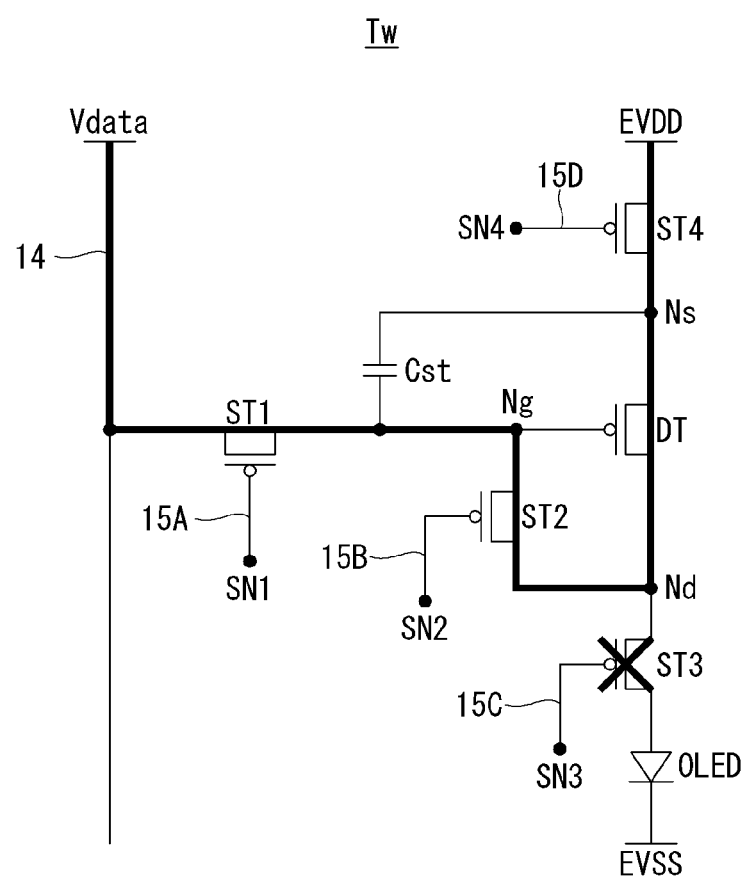

Referring to FIGS. 8 and 9B, the gate node Ng is programmed to a data voltage Vdata in the programming period Tw. During the programming period Tw, the first, second, and fourth switch TFTs ST1, ST2, and ST4 are respectively turned on in response to first, second, and fourth gate signals SN1, SN2, and SN4 of the ON level, while the third switch TFT ST3 is turned off in response to a third gate signal SN3 of the OFF level. During the programming period Tw, a data voltage Vdata is applied to a data line 14. During the programming period Tw, the fourth switch ST4 is turned on, thereby connecting the driving TFT DT to the high potential driving voltage EVDD and turning on the driving TFT DT. During the programming period Tw, the potential of the source node Ns becomes a high potential driving voltage EVDD of the ON level Lon, and the potential of the gate node Ng becomes the data voltage Vdata.

Figure 9C:
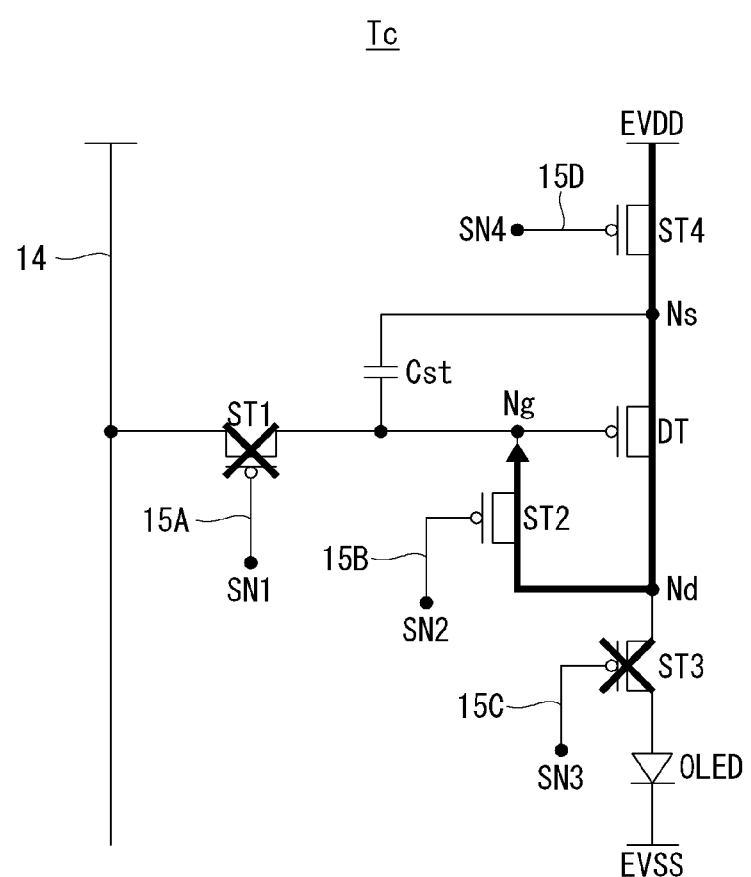

Referring to FIGS. 8 and 9C, in the compensation period Tc, the potential of the source node Ns is fixed to the high potential driving voltage EVDD and the potential of the gate node Ng is determined differently according to mobility of the driving TFT DT. In the compensation period Tc, the fourth switch TFT ST4 is maintained in the turned-on state, thereby forming a current path toward the driving TFT DT.

During the compensation period Tc, a driving current is flowing in the driving TFT DT, and the driving current corresponds to a value obtained by subtracting the data voltage Vdata from the source-gate voltage Vsg, that is, a high potential driving voltage EVDD of the ON level Lon. The first switch TFT ST1 is turned off in response to the first gate signal SN1 at the OFF level, while the second switch TFT ST2 is maintained in the turned-on state in response to the second gate signal SN2 of the ON level. As a result, during the compensation period Tc, the driving TFT is diode-connected due to a short circuit between the gate node Ng and the drain node Nd, and the potential of the gate node Ng is increased by the driving current. The potential of the gate node Ng is increased in proportion to the magnitude of the driving current. The magnitude of the driving current is proportional to mobility of the driving TFT DT, and therefore, the greater the mobility of the driving TFT DT, the higher the potential of the gate node Ng. In FIG. 8, a solid line, a bold dotted line, and a thin dotted line are drawn to show variation in the potential of the gate node Ng. The solid line corresponds to a case where the mobility of the driving TFT DT is $\Delta\alpha$; the bold dotted line corresponds to a case where the mobility of the driving TFT DT is $\Delta\alpha+20\%$; and the think dotted line corresponds to a case where the mobility of the driving TFT DT is $\Delta\alpha-20\%$.

In the compensation period Tc, the source-gate voltage Vsg of the driving TFT DT is determined to be inversely proportional to mobility of the driving TFT DT, and therefore, a driving current deviation caused by a variation in mobility of the driving TFT DT is compensated automatically. That is, when the mobility of the driving TFT DT is $\Delta\alpha+20\%$, a small magnitude of the source-gate voltage Vsg of the driving TFT DT is obtained as compared to when the mobility of the driving TFT DT is $\Delta\alpha$, and thus, the driving current generated by the driving TFT DT is compensated to be close to a driving current generated when the mobility of the driving TFT DT is Δα. In addition, when the mobility of the driving TFT DT is Δα−20%, a greater magnitude of the source-gate voltage Vsg of the driving TFT DT is obtained as compared to when the mobility of the driving TFT DT is Δα, and thus, the driving current generated by the driving TFT DT is compensated to be close to a driving current generated when the mobility of the driving TFT DT is Δα.

During the compensation period Tc, the third switch TFT ST3 is maintained in the turned-off state in response to the third gate signal SN3 of the OFF level in order to prevent flowing of the driving current into the OLED.

Figure 9D:
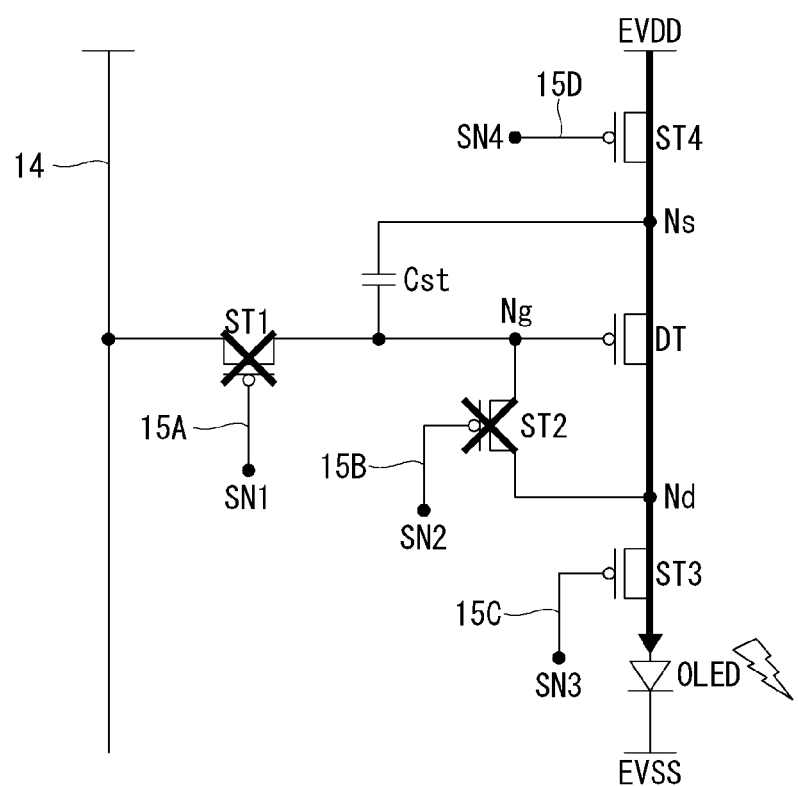

Referring to FIGS. 8 and 9D, a source-gate voltage Vsg of the driving TFT DT set in the compensation period TC is maintained even in the emission period Te, and accordingly, a driving current caused by compensation of mobility is following in the driving TFT DT. The third switch TFT ST3 is turned on in the emission period Te in response to the third gate signal SN3 of the ON level, so that a driving current generated by the driving TFT DT is applied to the OLED. The OLED emits light of a brightness corresponding to the driving current.

Figure 10:
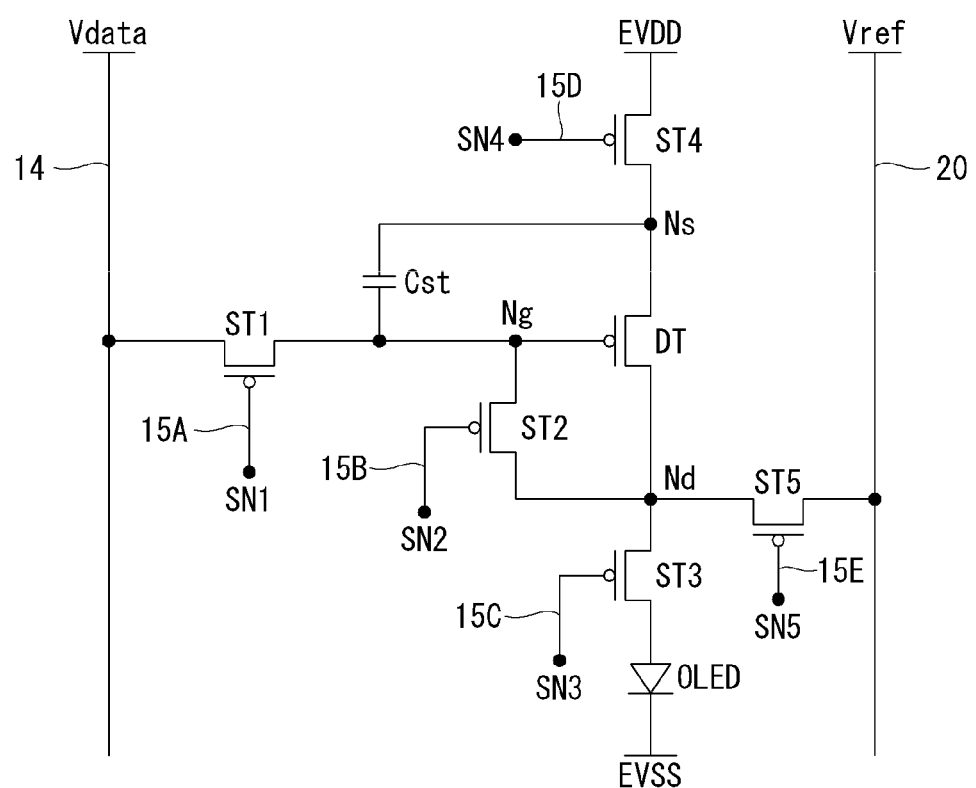
FIG. 10 is an equivalent circuit of a pixel, to which a hybrid compensation method is applied, according to a third embodiment of the present disclosure.

FIG. 10 is an equivalent circuit of a pixel according to a third embodiment of the present disclosure, the circuit to which a hybrid compensation method is applied.

Referring to FIG. 10, a pixel P of the present disclosure may include an OLED, a driving TFT DT, a storage capacitor Cst, a first switch TFT ST1, a second switch TFT ST2, a third switch TFT ST3, a fourth switch TFT ST4, and a fifth switch TFT ST5. The TFTs composing the pixel P may be implemented as P-type TFT. In addition, a semiconductor layer of each TFT composing the pixel P may include polysilicon or oxide.

Compared to the pixel P of FIG. 7, the pixel P of FIG. 10 further comprises a fifth switch TFT ST5 and receives supply of a reference voltage Vref through an additional reference line 20.

The fifth switch TFT ST5 includes a gate electrode connected to a fifth gate line 15E, and connects the reference line 20 and a drain node Nd in response to a fifth gate signal SN5. The fifth switch TFT ST5 includes a source electrode connected to the reference line 20, and a drain electrode connected to the drain node Nd.

Unlike the pixels of FIGS. 4 and 7, the pixel P of FIG. 10 is supplied with the reference voltage Vref not through the data line 14, but through the additional reference line 20.

Figure 11:
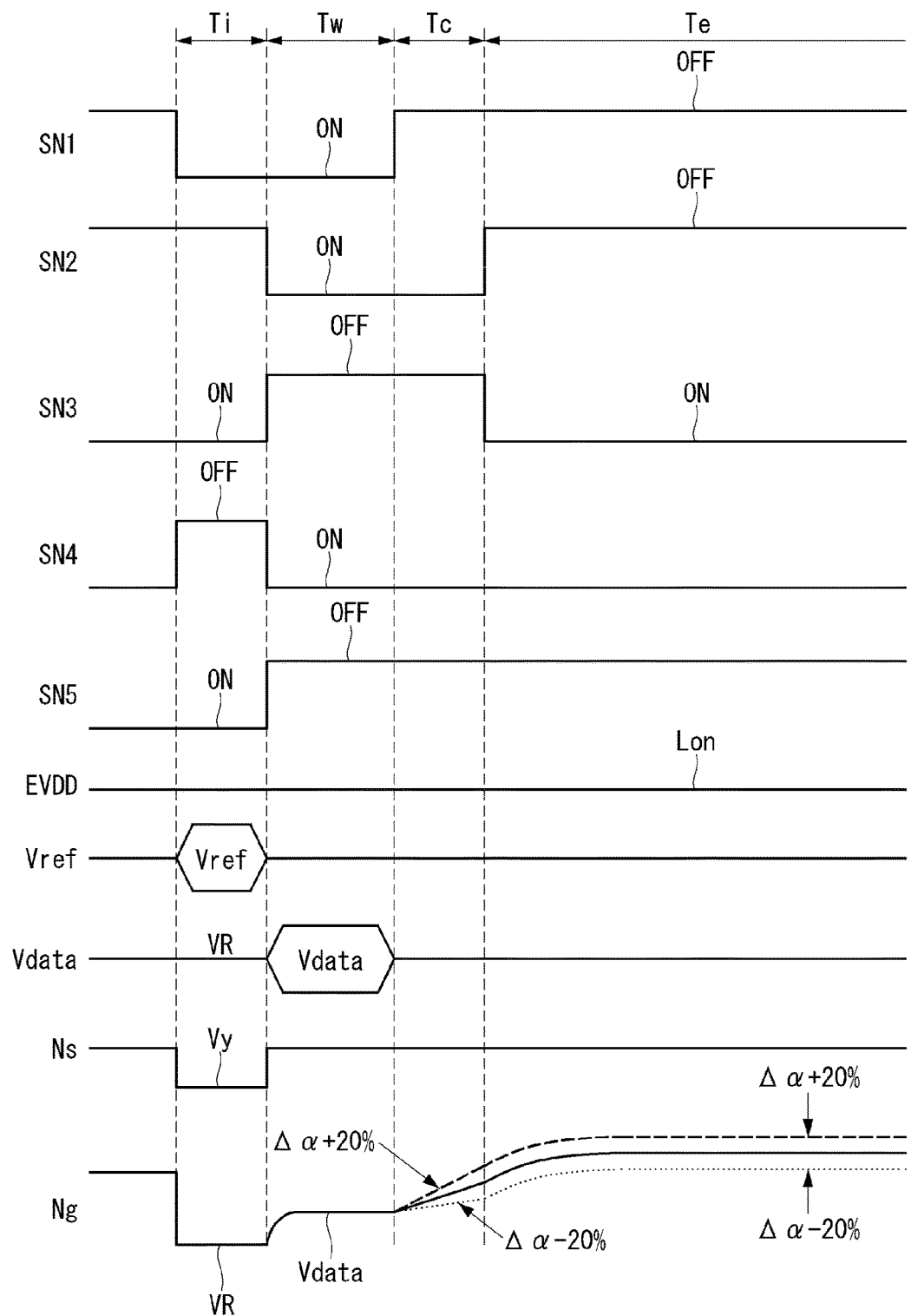
FIG. 11 is a timing diagram showing compensation of a variation in mobility of a driving TFT in the pixel of FIG. 10.

FIG. 11 is a timing diagram showing compensation of variation in mobility of a driving TFT in the pixel of FIG. 10. FIGS. 12A, 12B, 12C, and 12D are respective equivalent circuits of a pixel in an initialization period, a programming period, a compensation period, and an emission period shown in FIG. 11.

Referring to FIG. 11, in a normal driving mode for internal compensation, one frame includes an initialization period Ti, a programming period Tw, a compensation period Tc, and an emission period Te.

A data driving circuit 12 supplies a reference voltage Vref to the reference line 20 in the initialization period Ti before the compensation period Tc, and a data voltage Vdata to data lines 14 in the programming period Tw between the initialization period Ti and the compensation period Tc. Accordingly, the reference voltage Vref is applied to a drain node Nd through a fifth switch TFT ST5 during the initialization period Ti, and then the data voltage Vdata is applied to a gate node Ng through a first switch TFT ST1 during the programming period Tw. The data driving circuit 12 may supply a predetermined voltage VR, which is lower than the data voltage, to the data lines 14 during the initialization period Ti. As being applied to the gate node Ng through the first switch TFT ST1 during the initialization period Ti, the predetermined voltage VR may be used for initialization of the gate node Ng.

A high potential driving voltage EVDD is input at the ON level Lon during one frame. A fourth switch TFT ST4 is turned off during the initialization period Ti, thereby enabled to control a driving current path and secure operation stability.

Figure 12A:
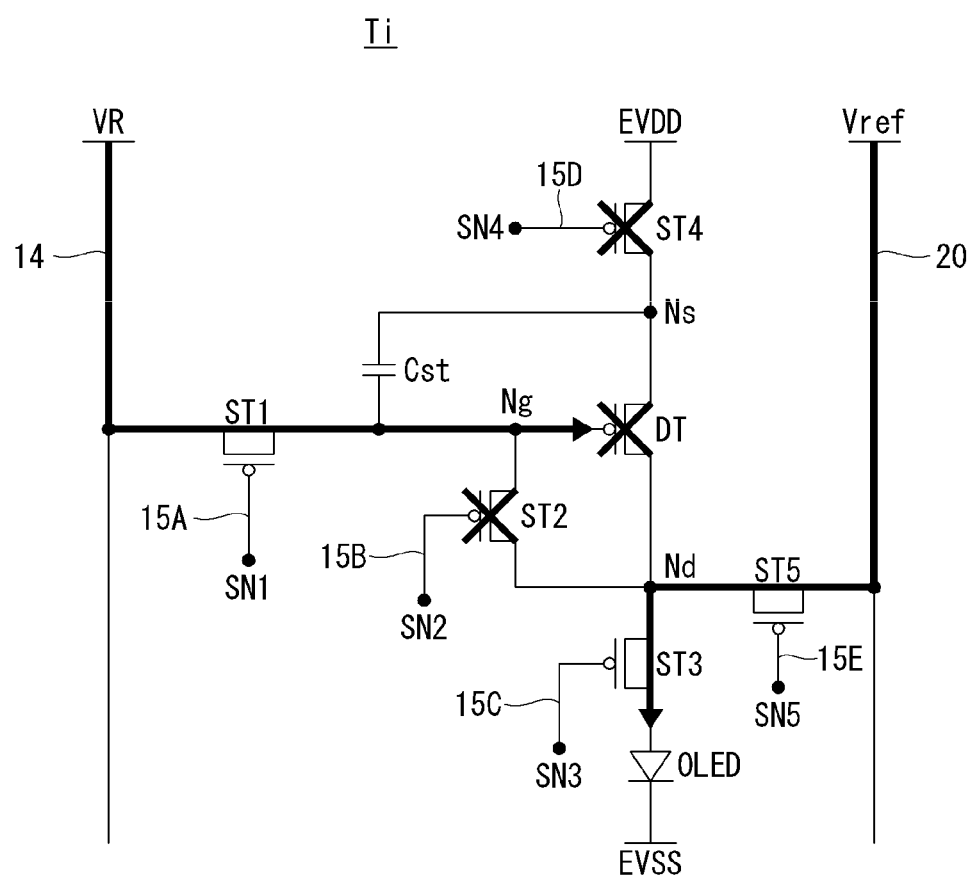
FIGS. 12A, 12B, 12C, and 12D are respective equivalent circuits of a pixel in an initialization period, a programming period, a compensation period, and an emission period shown in FIG. 11.

Referring to FIGS. 11 and 12A, the gate node Ng is initialized to the predetermined voltage VR in the initialization period Ti, and an OLED anode electrode is initialized to the reference voltage Vref. During the initialization period Ti, first, third, and fifth switch TFT ST1, ST3, and ST5 are respectively turned on in response to first, third, and fifth gate signals SN1, SN3, and SN5 of the ON level. In addition, the predetermined voltage VR is applied to a data line 14, and the reference voltage Vref is applied to a reference line 20. During the initialization period Ti, second and fourth switch TFTs ST2 and ST4 are respectively turned off in response to second and fourth gate signals SN2 and SN4 at the OFF level, and a driving TFT DT is turned off. During the initialization period Ti, the potential of the gate node Ng becomes the predetermined voltage VR, and accordingly, the potential of the source node Ns is reduced to Vy due to coupling effects of the storage capacitor Cst. During the initialization period Ti, the drain node Nd and the anode electrode of the OLED are initialized to the reference voltage Vref that is input through the fifth switch TFT ST5.

Figure 12B:
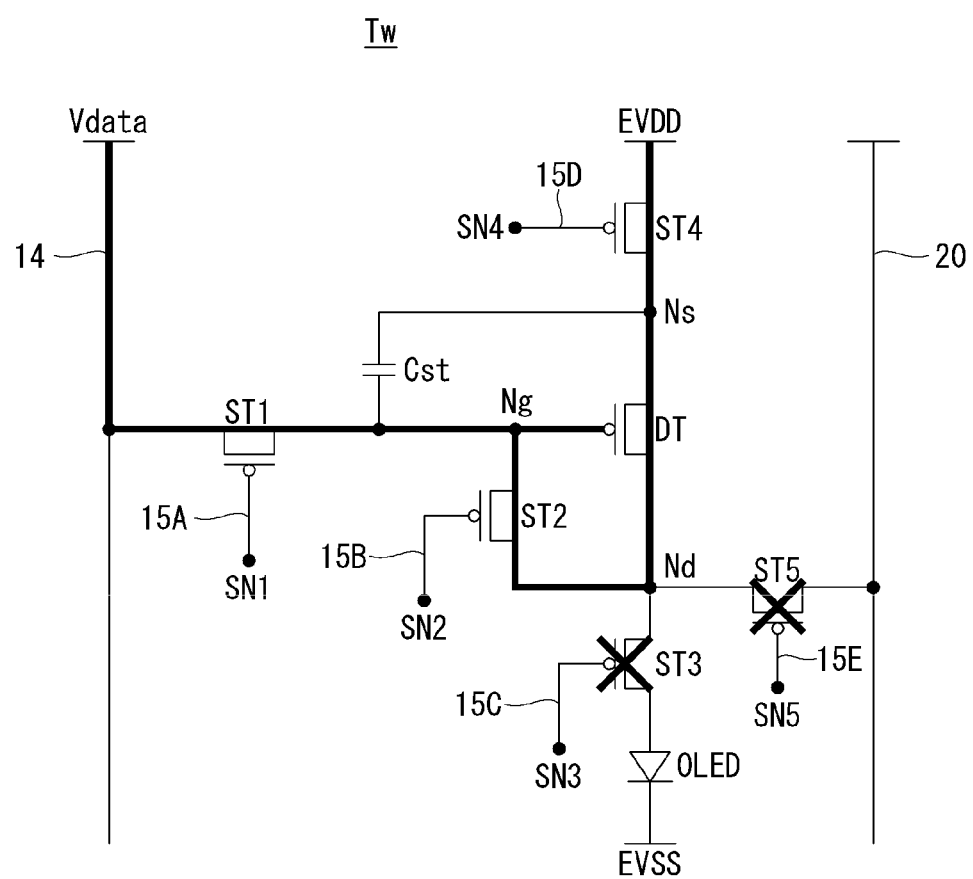

Referring to FIGS. 11 and 12B, the gate node Ng is programmed to the data voltage Vdata in the programming period Tw. During the programming period Tw, the first, second, and fourth switch TFTs ST1, ST2, and ST4 are respectively turned on in response to the first, second, and fourth gate signals SN1, SN2, and SN4 of the ON level, while the third and fifth switch TFTs ST3 and ST5 are respectively turned off in response to the third and fifth gate signals SN3 and SN5 of the OFF level. During the programming period Tw, the data voltage Vdata is applied to the data line 14.

The fourth switch TFT ST4 is turned on during the programming period Tw, thereby connecting the driving TFT DT to the high potential driving voltage EVDD and turning on the driving TFT DT. During the programming period Tw, the potential of the source node Ns becomes the high potential driving voltage EVDD of the ON level, and the potential of the gate node Ng becomes the data voltage Vdata.

Figure 12C:
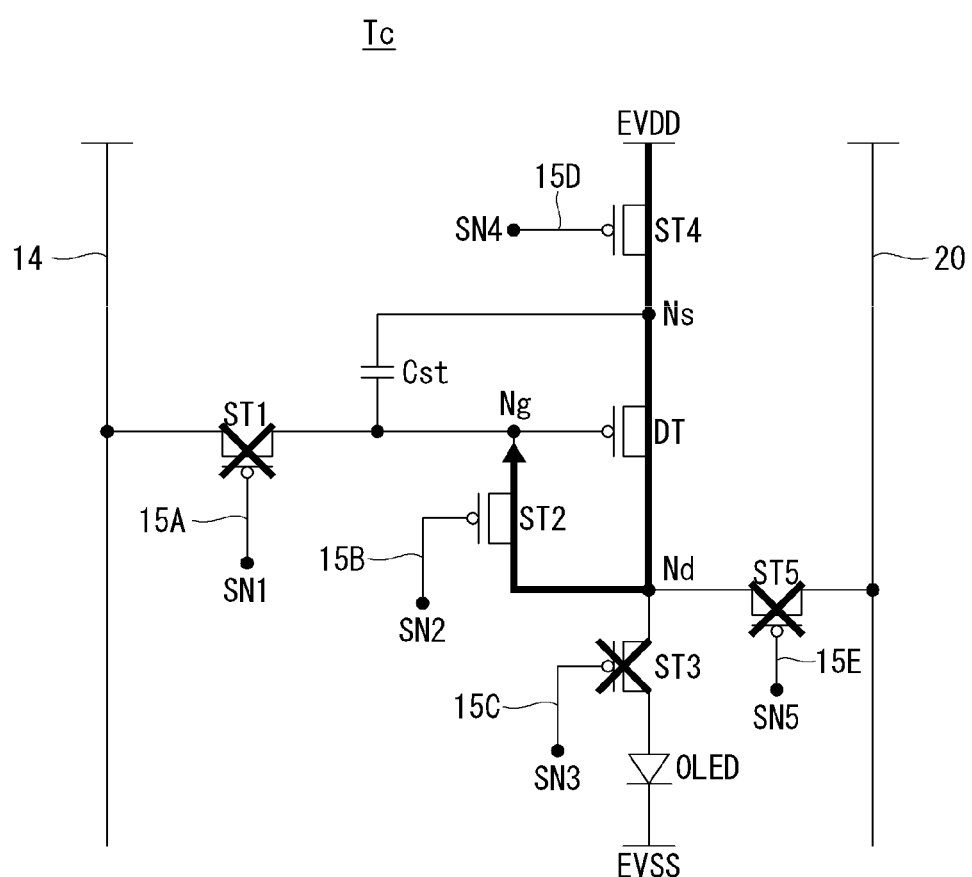

Referring to FIGS. 11 and 12C, in the compensation period Tc, the potential of the source node Ns is fixed to the high potential driving voltage EVDD, and the potential of the gate node Ng is determined differently according to mobility of the driving TFT DT. In the compensation period Tc, the fourth switch TFT ST4 is maintained in the turned-on state, thereby forming a current path toward the driving TFT DT.

During the compensation period Tc, a driving current is flowing in the driving TFT DT, and the driving current corresponds to a value obtained by subtracting the data voltage Vdata from the source-gate voltage Vsg that is the high potential voltage EVDD of the ON level Lon. At this point, the first switch TFT ST1 is turned off in response to a first gate signal SN1 of the OFF level, while the second switch TFT ST2 is maintained in the turned-on state in response to a second gate signal SN2 of the ON level. As a result, in the compensation period Tc, the driving TFT is diode-connected due to a short circuit between the gate node Ng and the drain node Nd, and the potential of the gate node Ng is increased by the driving current. The potential of the gate node Ng is increased in proportion to the magnitude of the driving current. The magnitude of the driving current is proportional to the mobility of the driving TFT DT, and thus, the greater the mobility of the driving TFT DT, the higher the potential of the gate node Ng. In FIG. 11, a solid line, a bold dotted line, and a thin dotted line are drawn to show variation in the potential of the gate node Ng. The solid line corresponds to a case where the mobility of the driving TFT DT is $\Delta\alpha$; the bold dotted line corresponds to a case where the mobility of the driving TFT DT is $\Delta\alpha+20\%$; and the think dotted line corresponds to a case where the mobility of the driving TFT DT is $\Delta\alpha-20\%$.

In the compensation period Tc, the source-gate voltage Vsg of the driving TFT DT is determined to be inversely proportional to the mobility of the driving TFT DT, and therefore, a driving current deviation caused by the variation in mobility of the driving TFT DT is compensated automatically. That is, when the mobility of the driving TFT DT is $\Delta\alpha+20\%$, a small magnitude of the source-gate voltage Vsg of the driving TFT DT is obtained as compared to when the mobility of the driving TFT DT is $\Delta\alpha$, and thus, the driving current generated by the driving TFT DT is compensated to be close to a driving current generated when the mobility of the driving TFT DT is $\Delta\alpha$. In addition, when the mobility of the driving TFT DT is $\Delta\alpha-20\%$, a greater magnitude of the source-gate voltage Vsg of the driving TFT DT is obtained as compared to when the mobility of the driving TFT DT is $\Delta\alpha$, and thus, the driving current generated by the driving TFT DT is compensated to be close to a driving current generated when the mobility of the driving TFT DT is $\Delta\alpha$.

During the compensation period Tc, the third switch TFT ST3 is maintained in the turned-off state in response to an off-level third gate signal SN3 of the OFF level in order to prevent flowing of the driving current into the OLED. During the compensation period Tc, the fifth switch TFT ST5 is maintained in the turned-off state in response to the fifth gate signal SN5 at the OFF level.

Figure 12D:
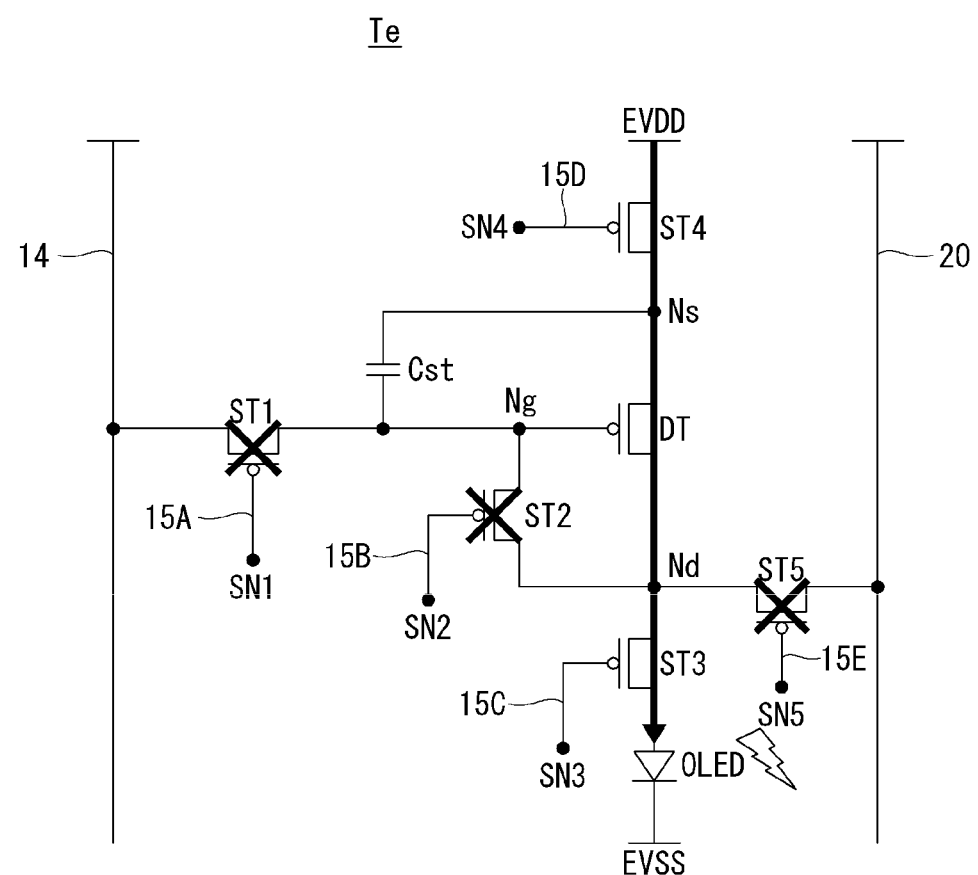

Referring to FIGS. 11 and 12D, a source-gate voltage Vsg of the driving TFT DT set in the compensation period TC is maintained even in the emission period Te, and accordingly, a driving current caused by compensation of mobility is following in the driving TFT DT. The third switch TFT ST3 is turned on in the emission period Te in response to a third gate signal SN3 of the ON level, so that a driving current generated by the driving TFT DT is applied to the OLED. The OLED emits light of a brightness corresponding to the driving current.

FIGS. 13 and 14 are diagrams for comparison of simulation results about a driving current deviation before and after compensation of mobility of a driving TFT of a pixel of the present disclosure.

Referring to FIGS. 13 and 14, a driving current Ioled is decreased inversely proportionally to a data voltage Vdata because a pixel of the present disclosure includes a P-type driving TFT DT. In the graph illustrating the driving current Ioled and the data voltage Vdata, a driving currents are different depending on mobility $\Delta\alpha$ of the driving TFT DT. If mobility is compensated as shown in (B) of FIG. 13, the difference in driving currents due to the mobility $\Delta\alpha$ can be dramatically reduced as compared with the case where the compensation is not carried out (see (A) of FIG. 13). For example, a difference between a diving current with mobility of 1.1 and a driving current with mobility of 1 is about 10% before compensation, and this difference is reduced to 0.2% after compensation. In addition, a difference between a driving current with mobility of 1 and a driving current with mobility of 0.9 is 10% before compensation, but this difference is reduced to 0.7% after compensation.

Figure 16:
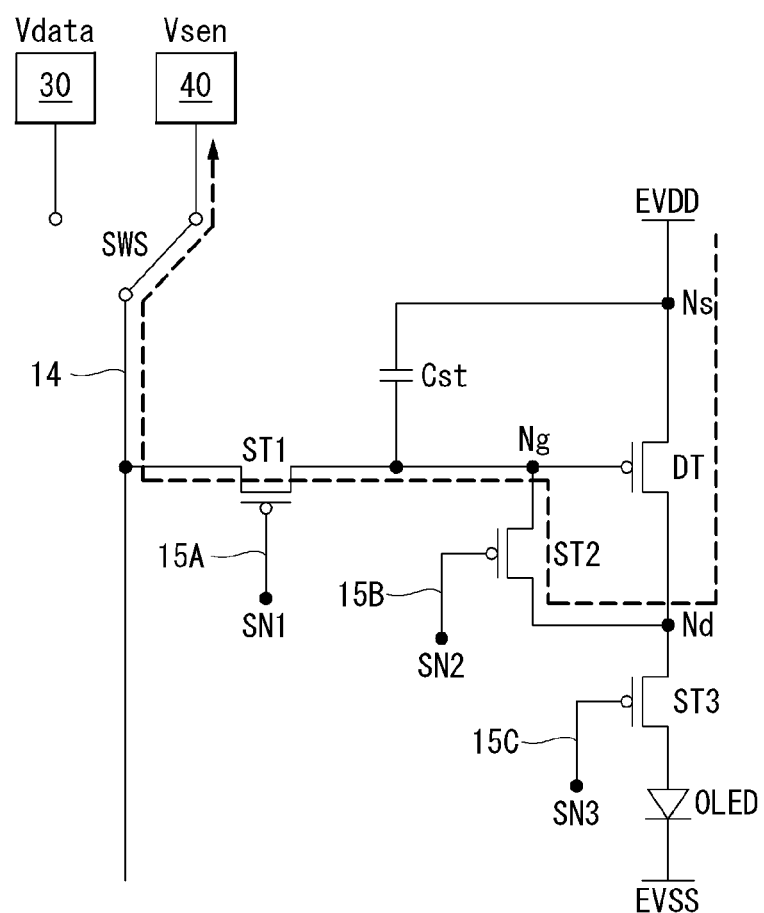
Figure 17:
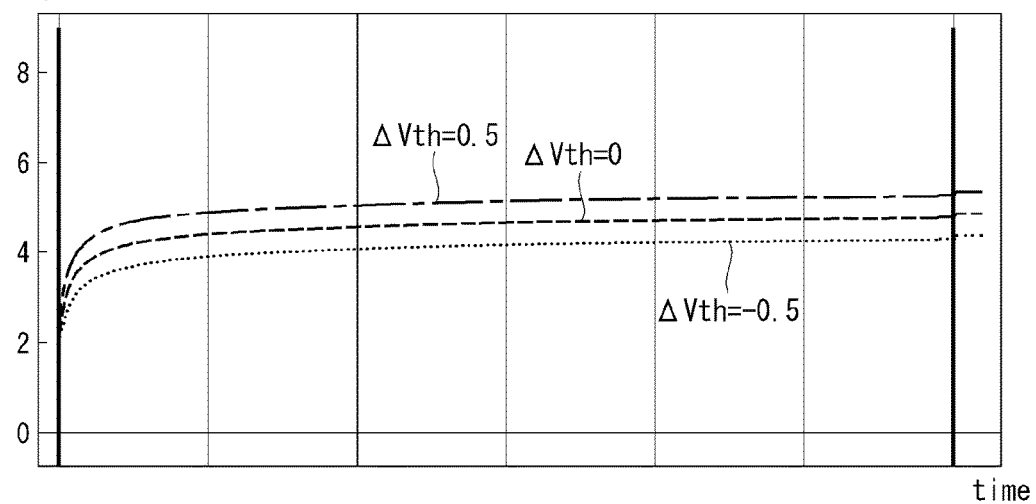

FIGS. 15 to 17 are diagrams schematically illustrating an external compensation method of compensating a threshold voltage of a driving TFT of a pixel of the present disclosure.

Referring to FIGS. 15 to 17, the above-described pixels of the present disclosure may employ an external compensation method to compensate for a variation in a threshold voltage of a driving TFT. A data driving circuit 12 of the present disclosure may further include a sensing unit 40 for sensing a threshold voltage of a driving TFT and outputting sensing data, in addition to a voltage generation unit 30 for generating and outputting a data voltage Vdata. The data driving circuit 12 may further include a switch device SWS for selectively connecting the voltage generation unit and the sensing unit 40 to a data line 14.

A timing controller may receive the sensing data from the sensing unit 40, and modulate input image data based on the sensing data according to the external compensation method.

To sense the threshold voltage of the driving TFT DT, first and second switches TFTs ST1 and ST2 may be respectively turned on in response to first and second gate signals SN1 and SN2 of the ON level, and a third switch TFT ST3 may be turned off in response to a third gate signal SN3 at the OFF level. The driving TFT DT is diode-connected when it is turned on, and, when a predetermined period of time elapses, the potential of a gate node Ng of the driving TFT DT is saturated at a threshold voltage Vth. The sensing unit 40 samples a voltage charged in the gate node Ng of the driving TFT DT to a threshold voltage Vth.

As described above, the present disclosure compensates for variations in a threshold voltage of a driving TFT in each pixel, which is composed of P-type driving TFTs, according to an external compensation method, and compensates for variations in mobility of the driving TFT according to an internal compensation method. The present disclosure senses a threshold voltage of a driving TFT using a diode-connected structure, or compensates for mobility of the driving TFT, thereby notably increasing accuracy.

Since the present disclosure compensates for mobility of a driving TFT in the inside while displaying an image, it is possible to streamline a compensation process and reduce a tact time required for the compensation.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. An organic light emitting display comprising:
a display panel on which a plurality of gate lines, a plurality of data lines, and a plurality of pixels are arranged, each pixel including an organic light emitting diode (OLED);
a gate driving circuit connected to the pixels through the plurality of gate lines; and
a data driving circuit connected to the pixels through the data lines,
wherein each of the pixels comprises:

a driving thin film transistor (TFT) having a gate electrode connected to a gate node, a source electrode connected to a source node, and a drain electrode connected to a drain node;
a first switch TFT having a gate electrode connected to a first gate line, and configured to connect the gate node and a data line in response to a first gate signal;
a second switch TFT having a gate electrode connected to a second gate line, and configured to connect the gate node and the drain node in response to a second gate signal;
a third switch TFT having a gate electrode connected to a third gate line, and configured to connect the drain node and an anode electrode of the OLED in response to a third gate signal; and
a storage capacitor connected between the gate node and the source node, and
wherein the first switch TFT, the second switch TFT, the third switch TFT and the driving TFT are P-type TFTs.

2. The organic light emitting display of claim 1, wherein in a compensation period for compensating for mobility of the driving TFT, the driving TFT is diode-connected due to a connection between the gate node and the drain node, and
wherein a potential of the source node is fixed to a high potential driving voltage, and a potential of the gate node is determined differently according to the mobility of the driving TFT.

3. The organic light emitting display of claim 2, wherein, in the compensating period, the potential of the gate node is determined proportional to the mobility of the driving TFT.

4. The organic light emitting display of claim 2,
wherein the data driving circuit supplies a reference voltage to the data lines in an initialization period before the compensation period, and supplies a data voltage to the data lines in a programming period between the initialization period and the compensation period, and
wherein the reference voltage is applied to the gate node through the first switch TFT during the initialization period, and the data voltage is applied to the gate node through the first switch TFT during the programming period.

5. The organic light emitting display of claim 4,
wherein, in the initialization period and the programming period, the high potential driving voltage is input at an OFF level which enables turning off the driving TFT, and
wherein, in the compensation period and an emission period following the compensation period, the high potential driving voltage is input at an ON level which is higher than the OFF level and which enables turning on the driving TFT.

6. The organic light emitting display of claim 2, wherein each of the pixels further comprises a fourth switch TFT which has a gate electrode connected to a fourth gate line and which connects an input terminal of the high potential driving voltage and the source node in response to a fourth gate signal,
wherein the fourth switch TFT is P-type TFT.

7. The organic light emitting display of claim 6,
wherein the data driving circuit supplies a reference voltage to the data lines in an initialization period before the compensation period, and a data voltage to the data lines in a programming period between the initialization period and the compensation period, and
wherein the reference voltage is applied to the gate node through the first switch TFT in the initialization period, and the data voltage is applied to the gate node through the first switch TFT in the programming period.

8. The organic light emitting display of claim 7,
wherein the high potential driving voltage is maintained at an ON level which enables turning on the driving TFT in the initialization period, the programming period, the compensation period, and an emission period following the compensation period, and
wherein the fourth switch TFT is turned off only in the initialization period.

9. The organic light emitting display of claim 6,
wherein reference lines connected to the pixels are further provided on the display panel, and
wherein each of the pixels further comprises a fifth switch TFT which has a gate electrode connected to a fifth gate line and which connects any one of the reference lines and the drain node in response to a fifth gate signal,
wherein the fifth switch TFT is P-type TFT.

10. The organic light emitting display of claim 9,
wherein the data driving circuit supplies a reference voltage to the reference lines in an initialization period before the compensation period, and a data voltage to the data lines in a programming period between the initialization period and the compensation period, and
wherein the reference voltage is applied to the drain node through the fifth switch TFT in the initialization period, and the data voltage is applied to the gate node through the first switch TFT in the programming period.

11. The organic light emitting display of claim 10,
wherein the high potential driving voltage is maintained at an ON level which enables turning on the driving TFT in the initialization period, the programming period, the compensation period, and an emission period following the compensation period, and
wherein the fifth switch TFT is turned on only in the initialization period.

12. The organic light emitting display of claim 1,
wherein the data driving circuit comprises a sensing unit configured to sense a threshold voltage of the driving TFT and output sensing data, and
wherein the display panel further comprises a timing controller configured to control operation timing of the data driving circuit and the gate driving circuit and modulate input image data based on the sensing data.

13. A driving method of an organic light emitting display which comprises a plurality of pixels, wherein each of the pixels comprises a driving thin film transistor TFT having a gate electrode connected to a gate node, a source electrode connected to a source node, and a drain electrode connected to a drain node; an organic light emitting diode OLED; and a plurality of switch TFTs, wherein the driving TFT and the plurality switch TFTs are P-type TFTs, and wherein the driving method comprises:
in an initialization period, turning on a first switch TFT of the plurality of switch TFTs to apply a reference voltage of a data line to the gate node, turning on a second switch TFT of the plurality of switch TFTs to connect the gate node and the drain node, and turning on a third switch TFT of the plurality of switch TFTs to connect the drain node and the OLED;
in a programming period following the initialization period, turning on the first switch TFT to apply a data voltage of the data line to the gate node, turning on the second switch TFT to connect the gate node and the drain node, and turning off the third switch TFT to disconnect the drain node and the OLED;

in a compensation period following the programming period, turning off the first switch TFT to disconnect the data line and the gate node, turning on the second switch TFT to connect the gate node and the drain node, and turning off the third switch TFT to disconnect the drain node and the OLED; and in an emission period following the compensation period, turning off the first switch TFT to disconnect the data line and the gate node, turning off the second switch TFT to disconnect the gate node and the drain node, and turning on the third switch TFT to connect the drain node and the OLED.

14. The driving method of claim 13,
wherein, in the compensation period, the driving TFT is diode-connected due to a connection between the gate node and the drain node, and
wherein a potential of the source node is fixed to a high potential driving voltage and a potential of the gate node is determined differently according to mobility of the driving TFT.

15. The driving method of claim 14, wherein, in the compensation period, the potential of the gate node is determined proportional to mobility of the driving TFT.

16. The driving method of claim 14,
wherein, in the initialization period and the programming period, the high potential driving voltage is input at an OFF level which enables turning off the driving TFT, and
wherein, in the compensation period and the emission period, the high potential driving voltage is input at an ON level which is higher than the OFF level and which enables turning on the driving TFT.

17. The driving method of claim 14,
Wherein in the initialization period, a fourth switch TFT of the plurality of switch TFTs is turned off to disconnect an input terminal of the high potential driving voltage and the source node, and
wherein in each of the programming period, the compensation period, and the emission period, the fourth switch TFT is turned on to connect the input terminal of the high potential driving voltage and the source node.

18. The driving method of claim 17, wherein the high potential driving voltage is maintained at an ON level which enables turning on the driving TFT in the initialization period, the programming period, the compensation period, and the emission period.

19. A driving method of an organic light emitting display comprising a plurality of pixels, wherein each of the pixels comprises: a driving thin film transistor (TFT) having a gate electrode connected to a gate node, a source electrode connected to a source node, and a drain electrode connected to a drain node; an organic light emitting diode (OLED); and a first switch TFT, a second switch TFT, a third switch TFT, a fourth switch TFT and a fifth switch TFT, wherein the driving TFT and the first to fifth switch TFTs are implemented as P-type TFTs, wherein the method comprises:

in an initialization period, turning on the first switch TFT to connect a data line and the gate node, turning off the second switch TFT to disconnect the gate node and the drain node, turning on the third switch TFT to connect the drain node and the OLED, turning off the fourth switch TFT to disconnect an input terminal of a high potential driving voltage and the source node, and turning on the fifth switch TFT to apply a reference voltage of a reference line to the drain node;

in a programming period following the initialization period, turning on the first switch TFT to apply a data voltage of the data line to the gate node, turning on the second switch TFT to connect the gate node and the drain node, turning off the third switch TFT to disconnect the drain node and the OLED, turning on the fourth switch TFT to connect the input terminal of the high potential driving voltage and the source node, and turning off the fifth switch TFT to disconnect the reference line and the drain node;

in a compensation period following the programming period, turning off the first switch TFT to disconnect the data line and the gate node, turning on the second switch TFT to connect the gate node and the drain node, turning off the third switch TFT to disconnect the drain node and the OLED; turning on the fourth switch TFT to connect the input terminal of the high potential driving voltage and the source node, and turning off the fifth switch TFT to disconnect the reference line and the drain node; and in an emission period following the compensation period, turning off the first switch TFT to disconnect the data line and the gate node, turning off the second switch TFT to disconnect the gate node and the drain node, turning on the third switch TFT to connect the drain node and the OLED, turning on the fourth switch TFT to connect the input terminal of the high potential driving voltage and the source node, and turning off the fifth switch TFT to disconnect the reference line and the drain node.

20. The driving method of claim 19, further comprising:
outputting sensing data by sensing a threshold voltage of the driving TFT; and
modulating input image data based on the sensing data.

21. An organic light emitting display comprising:
a display panel on which a plurality of gate lines, a plurality of data lines, and a plurality of pixels are arranged, each pixel including an organic light emitting diode (OLED);
a gate driving circuit connected to the pixels through the plurality of gate lines; and
a data driving circuit connected to the pixels through the data lines,
wherein each of the pixels comprises:
a driving thin film transistor (TFT) having a gate electrode, a source electrode connected to an input terminal of the high potential driving voltage, and a drain electrode connected to the OLED;
a first switch TFT configured for supplying a data voltage to the gate electrode of the driving TFT;
a second switch TFT connected between the gate electrode and the drain electrode of the driving TFT;
a third switch TFT connected between the drain electrode of the driving TFT and the OLED; and
a storage capacitor connected between the gate electrode and the source electrode of the driving TFT, and
wherein the first switch TFT, the second switch TFT, the third switch TFT and the driving TFT are P-type TFTs,
wherein in a compensation period for compensating for mobility of the driving TFT, the driving TFT is diode-connected due to a short circuit between the gate electrode and the drain electrode of the driving TFT, and wherein a potential of the source electrode of the driving TFT is fixed to a high potential driving voltage, and wherein a potential of the gate electrode of the driving TFT is increased from the data voltage according to the current flowing between the source electrode and the drain electrode of the driving TFT, the increase of the potential of the gate electrode of the drain TFT is proportional to mobility of the driving TFT.

22. The organic light emitting display of claim 21,
wherein the data driving circuit comprises a sensing unit configured to sense a threshold voltage of the driving TFT and output sensing data, and
wherein the display panel further comprises a timing controller configured to control operation timing of the data driving circuit and the gate driving circuit and modulate input image data based on the sensing data.

* * * * *